US012730381B2

(12) United States Patent
Tsai et al.

(10) Patent No.: US 12,730,381 B2
(45) Date of Patent: Sep. 8, 2026

(54) INSPECTION TOOL FOR A SEMICONDUCTOR PROCESSING TOOL AND METHODS OF USE

(71) Applicant: Taiwan Semiconductor Manufacturing Company, Ltd., Hsinchu (TW)

(72) Inventors: Ming-Hsun Tsai, Hsinchu City (TW); Cheng-Hao Lai, Taichung City (TW); Shang-Chieh Chien, New Taipei City (TW); Li-Jui Chen, Hsinchu City (TW); Heng-Hsin Liu, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1176 days.

(21) Appl. No.: 17/659,453

(22) Filed: Apr. 15, 2022

(65) Prior Publication Data

US 2022/0404716 A1 Dec. 22, 2022

Related U.S. Application Data

(60) Provisional application No. 63/202,601, filed on Jun. 17, 2021.

(51) Int. Cl.
*G03F 7/00* (2006.01)

(52) U.S. Cl.
CPC ...... *G03F 7/70516* (2013.01); *G03F 7/70033* (2013.01); *G03F 7/70716* (2013.01)

(58) Field of Classification Search
CPC ............... G03F 7/0516; G03F 7/70033; G03F 7/70716; G03F 7/70691; G03F 7/7085; G03F 7/7075
See application file for complete search history.

(56) References Cited

U.S. PATENT DOCUMENTS

| | | | | |
|---|---|---|---|---|
| 6,392,738 | B1 | 5/2002 | Van De Pasch et al. | |
| 6,856,376 | B2 | 2/2005 | Heerens et al. | |
| 12,051,629 | B2 | 7/2024 | Hyun et al. | |
| 12,243,213 | B2 * | 3/2025 | Iwanaga | G01N 21/956 |
| 2008/0218712 | A1 | 9/2008 | Compen et al. | |
| 2014/0014138 | A1 | 1/2014 | Spiegelman et al. | |
| 2014/0146297 | A1 * | 5/2014 | Vainer | G03F 1/84 250/226 |
| 2018/0329292 | A1 | 11/2018 | Kanehara et al. | |
| 2020/0019072 | A1 * | 1/2020 | Wu | G03F 7/707 |
| 2020/0255968 | A1 * | 8/2020 | Mukaiyama | G01N 21/94 |
| 2020/0292932 | A1 * | 9/2020 | Lee | G03F 1/42 |
| 2021/0066140 | A1 | 3/2021 | Hyun et al. | |
| 2021/0202293 | A1 * | 7/2021 | Akbas | H01L 21/6875 |

FOREIGN PATENT DOCUMENTS

| | | | |
|---|---|---|---|
| JP | 2008282885 | A | 11/2008 |
| JP | 2019100968 | A | 6/2019 |
| JP | 2020197731 | A | 12/2020 |
| KR | 20030080182 | A | 10/2003 |
| KR | 100748449 | B1 | 8/2007 |
| KR | 20210026955 | A | 3/2021 |

OTHER PUBLICATIONS

Machine Translation of JP 6570084B (Year: 2019).*
Machine Translation of JP2012234021A (Year: 2012).*

* cited by examiner

*Primary Examiner* — Sharidan Carrillo
(74) *Attorney, Agent, or Firm* — Harrity & Harrity, LLP

(57) ABSTRACT

A wafer table inspection tool described herein is capable of being positioned over a wafer table while the wafer table is positioned in a bottom module of an exposure tool of a lithography system. The wafer table inspection tool is capable of quickly evaluating the condition of surface burls on the wafer table and evaluating cleaning performance of a cleaning operation in which the surface burls are cleaned.

20 Claims, 17 Drawing Sheets

700

INSPECTION TOOL FOR A SEMICONDUCTOR PROCESSING TOOL AND METHODS OF USE

CROSS-REFERENCE TO RELATED APPLICATION

This Patent Application claims priority to U.S. Provisional Patent Application No. 63/202,601, filed on Jun. 17, 2021, and entitled "INSPECTION TOOL FOR A SEMICONDUCTOR PROCESSING TOOL AND METHODS OF USE." The disclosure of the prior Application is considered part of and is incorporated by reference into this Patent Application.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
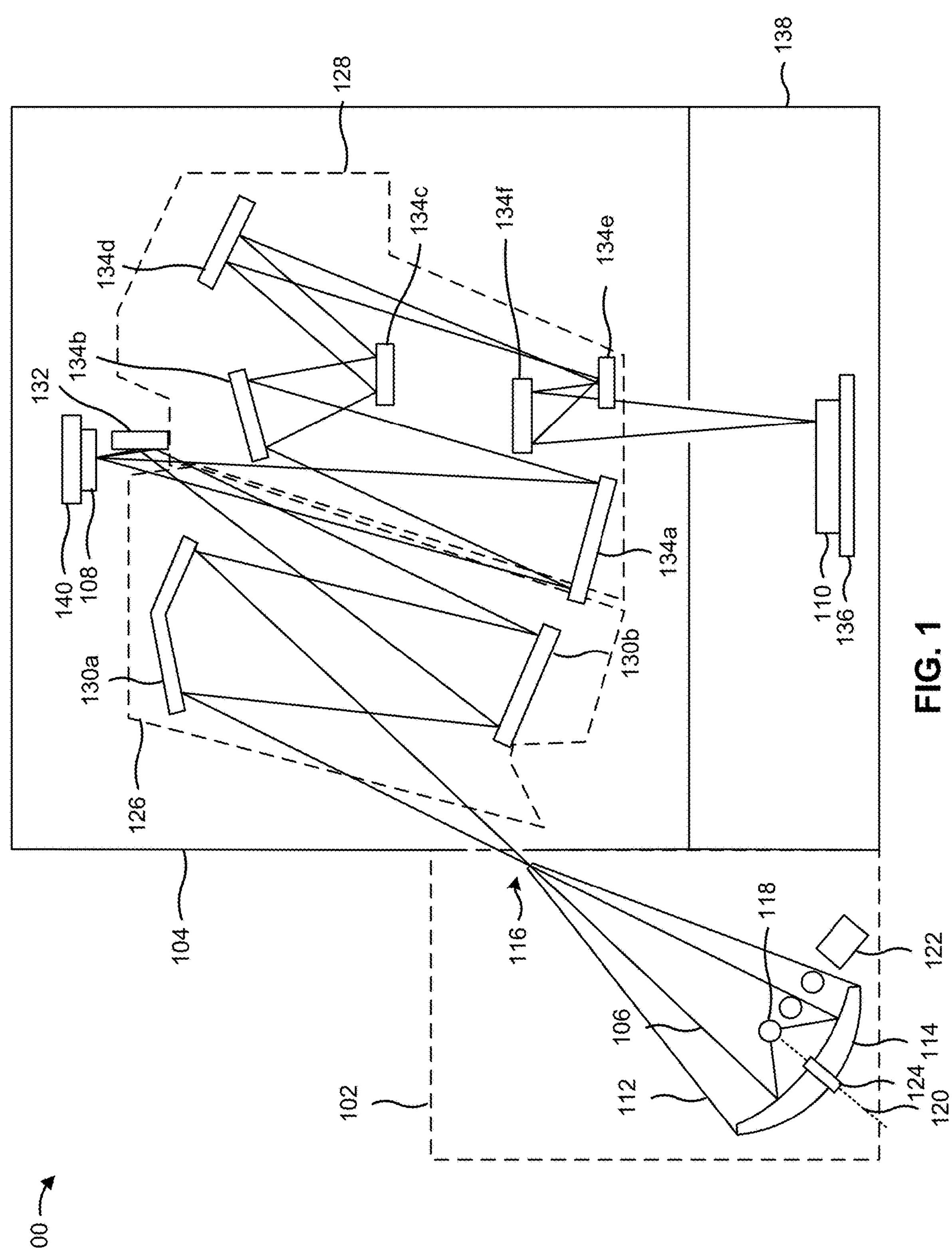
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A lithography system, such as an extreme ultraviolet (EVU) lithography system, includes a wafer stage on top of which a wafer table is positioned to support a semiconductor substrate such as a wafer. The surface quality of the wafer table may be unable to be directly and/or quantitatively inspected after the wafer table is cleaned or even if brand new.

When a wafer table becomes contaminated, the wafer table is removed from the lithography system for cleaning (which causes downtime of the lithography system). After a cleaning operation, the wafer table is re-installed into the lithography system, the lithography system is pumped down to a vacuum, and a test exposure is then performed on a semiconductor substrate. Results of the test exposure, which may include a map of the exposed semiconductor substrate, are reviewed to extrapolate a cleaning performance of the cleaning operation. If the cleaning performance is determined to be unsatisfactory, the vacuum is removed from the lithography system, the wafer table is removed and cleaned again in a subsequent cleaning operation, and the testing process is repeated to verify the cleaning performance of the subsequent cleaning operation.

The above-described cleaning verification technique may result in significant downtime of the lithography system and may provide inaccurate cleaning performance verification. As an example, the process of re-installing the wafer table in the lithography system and pumping the lithography system down to a vacuum may take approximately 6 or more hours and the test exposure and cleaning performance evaluation may take approximately 4 or more hours. If additional cleaning is to be performed, the venting (or removal of the vacuum) and subsequent cleaning operation may take approximately 4 or more hours, and then another 10 or more hours to re-test the wafer table.

Some implementations described herein provide a wafer table inspection tool and associated techniques for directly inspecting a wafer table using the wafer table inspection tool. The wafer table inspection tool is capable of being positioned over the wafer table while the wafer table is positioned in a bottom module of an exposure tool of a lithography system. The wafer table inspection tool is capable of quickly generating inspection images for evaluating the condition of surface burls on the wafer table, and for evaluating cleaning performance of a cleaning operation during which the surface burls are cleaned.

The wafer table inspection tool described herein greatly reduces the time duration of inspecting and (if needed) recleaning a wafer table in that inspection of the wafer table using the wafer table inspection tool is performed in atmospheric conditions (e.g., without having to re-install the wafer table in the lithography system, without having to pump the lithography system down to a vacuum to perform a test exposure, and without having to vent the lithography system for additional cleaning). This reduces downtime of the lithography system and increases productivity and throughput of the lithography system. Moreover, the inspection images generated by the inspection tool can be used, along with other techniques described herein such as machine learning, to estimate and plan for subsequent cleaning operations and wafer table replacement.

FIG. 1 is a diagram of an example lithography system 100 described herein. The lithography system 100 includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner tool, and EUV exposure tool, or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., droplets of a target material including Sn droplets or another type of droplets) of a target material being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide ($CO_2$) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser beam 120 is pulsed at a timing that is synchronized with the flow of the droplets 118 from the DG head 122. In some implementations, the laser beam 120 includes a plurality of pulses, such as a "pre-pulse" that is to deform a droplet 118 (e.g., to increase the surface area of the droplet 118 and/or to partially excite the droplet 118) and a subsequent "main-pulse" that is to convert the droplet 118 to the plasma.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130*a* and a mirror 130*b*. The mirror 130*a* includes a field facet mirror (FFM) or another type of mirror that includes a plurality of field facets. The mirror 130*b* includes a pupil facet mirror (PFM) or another type of mirror that also includes a plurality of pupil facets. The facets of the mirrors 130*a* and 130*b* are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134*a*-134*f*. In some implementations, the mirrors 134*a*-134*f* are configured to focus or reduce the radiation 106 into an exposure field, which may include one or more die areas on the semiconductor substrate 110.

The exposure tool 104 includes a wafer stage 136 (or a substrate stage) configured to support the semiconductor substrate 110. Moreover, the wafer stage 136 is configured to move (or step) the semiconductor substrate 110 through a plurality of exposure fields as the radiation 106 transfers the pattern from the reticle 108 onto the semiconductor substrate 110. The wafer stage 136 is included in a bottom module 138 of the exposure tool 104. The bottom module 138 includes a removable subsystem of the exposure tool 104. The bottom module 138 may slide out of the exposure tool 104 and/or otherwise may be removed from the exposure tool 104 to enable cleaning and inspection of the wafer stage 136 and/or the components of the wafer stage 136. The bottom module 138 isolates the wafer stage 136 from other areas in the exposure tool 104 to reduce and/or minimize contamination of the semiconductor substrate 110. Moreover, the bottom module 138 may provide physical isolation for the wafer stage 136 by reducing the transfer of vibrations (e.g., vibrations in the semiconductor processing environment in which the lithography system 100 is located, vibrations in the lithography system 100 during operation of the lithography system 100) to the wafer stage 136 and, therefore, the semiconductor substrate 110. This reduces movement and/or disturbance of the semiconductor substrate 110, which reduces the likelihood that the vibrations may cause a pattern misalignment.

The exposure tool 104 also includes a reticle stage 140 that is configured to support and/or secure the reticle 108. Moreover, the reticle stage 140 is configured to move or slide the reticle through the radiation 106 such that the reticle 108 is scanned by the radiation 106. In this way, a pattern that is larger than the field or beam of the radiation 106 may be transferred to the semiconductor substrate 110.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130*a* of the illuminator 126. The mirror 130*a* reflects the radiation 106 onto the mirror 130*b*, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 06 toward the mirror 134*a* in the projection optics box 128, which reflects the radiation 106 onto the mirror 134*b*. The radiation 106 continues to be reflected and reduced in the projection optics box 128 by the mirrors 134*c*-134*f*. The mirror 134*f* reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2:
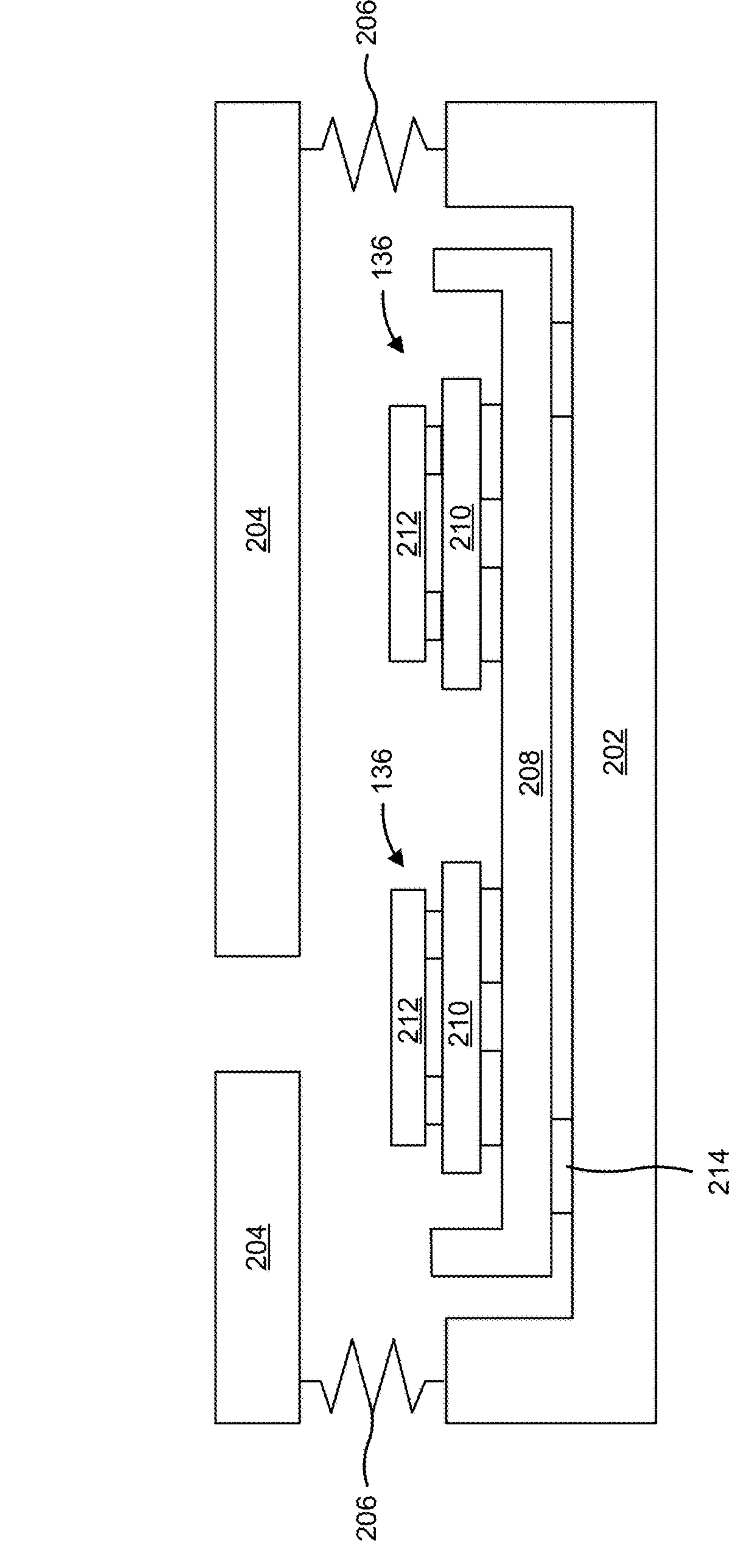
FIG. 2 is a diagram of an example bottom module described herein for use in the lithography system of FIG. 1.

FIG. 2 is a diagram of an example bottom module 138 described herein for use in the lithography system 100 of FIG. 1. As shown in FIG. 2, the bottom module 138 includes a base frame 202 (which may also be referred to as a support frame). The base frame 202 interfaces with the floor of a semiconductor processing environment in which the lithography system 100 is located. The base frame 202 further supports other components included in the bottom module 138. In some implementations, wheels, castors, or other components are included on the bottom of the base frame 202 to permit the base frame 202 to slide or displace relative to the exposure tool 104. This permits the base frame 202 to be removed from the exposure tool 104.

A metrology frame 204 is located above the base frame 202 and separates the bottom module 138 from a vacuum chamber in which the illuminator 126 and the projection optics box 128 are located. An opening is included in the metrology frame 204 to permit the radiation 106 to project into the bottom module 138 and toward a wafer stage 136. The metrology frame 204 and the base frame 202 are coupled in an elastomeric manner by isolation components 206. The isolation components 206 provide vibration isolation between the bottom module 138 and the metrology frame 204 by reducing the transfer of vibrations between the bottom module 138 and the metrology frame 204. The isolation components 206 include springs, an active vibration isolation system, a suspension system, and/or an air mount system, among other examples.

A balance mass 208 is included and/or positioned over the base frame 202. One or more wafer stages 136 are included and/or positioned over the balance mass 208. In some implementations, the bottom module 138 includes a plurality of wafer stages 136. A first wafer stage 136 may be utilized for exposing a first semiconductor substrate 110 to the radiation 106 while a second wafer stage 136 is utilized for measurement and alignment purposes of a second semiconductor substrate 110 in preparation for exposure. In this way, the plurality of wafer stages 136 may enable increased throughput of the lithography system by performing simultaneous actions on a plurality of semiconductor substrates 110 to reduce queue times.

The balance mass 208 is configured to absorb and/or counteract movement and/or vibration of the wafer stage(s) 136. This may enable the wafer stage(s) 136 to move more smoothly and with less perturbation to the semiconductor substrate(s) 110 included thereon, which decreases the likelihood of misalignment and yield loss. The balance mass 208 is supported on isolation structures 214 between the balance mass 208 and the base frame 202. The isolation structures 214 include air feet, springs, and/or another type of isolation structures.

A wafer stage 136 includes a chuck 210 and a wafer table 212. The chuck 210 is included over the balance mass 208. The wafer table 212 (or wafer clamp) is included over the chuck 210. Isolation structures 214 are included between the chuck 210 and the balance mass 208, and between the wafer table 212 and the chuck 210.

The chuck 210 is configured to secure a semiconductor substrate 110 to the wafer table 212 by electrostatic force (e.g., an electrostatic chuck, e-chuck, or ESC), a vacuum force (e.g., a vacuum chuck), or another type of force. The wafer table 212 is configured to support a semiconductor substrate 110 on the wafer table 212. The wafer table 212 includes a substantially round structure that is sized to accommodate one or more sizes of semiconductor substrates 110, such as 200 millimeter semiconductor substrates 110, 300 millimeter semiconductor substrates 110, and/or another size of semiconductor substrates 110. In some implementations, the wafer table 212 includes another shape, such as a substantially square shape or a substantially rectangular shape, among other examples.

As indicated above, FIG. 2 is provided as an example. Other examples may differ from what is described with regard to FIG. 2.

Figure 3:
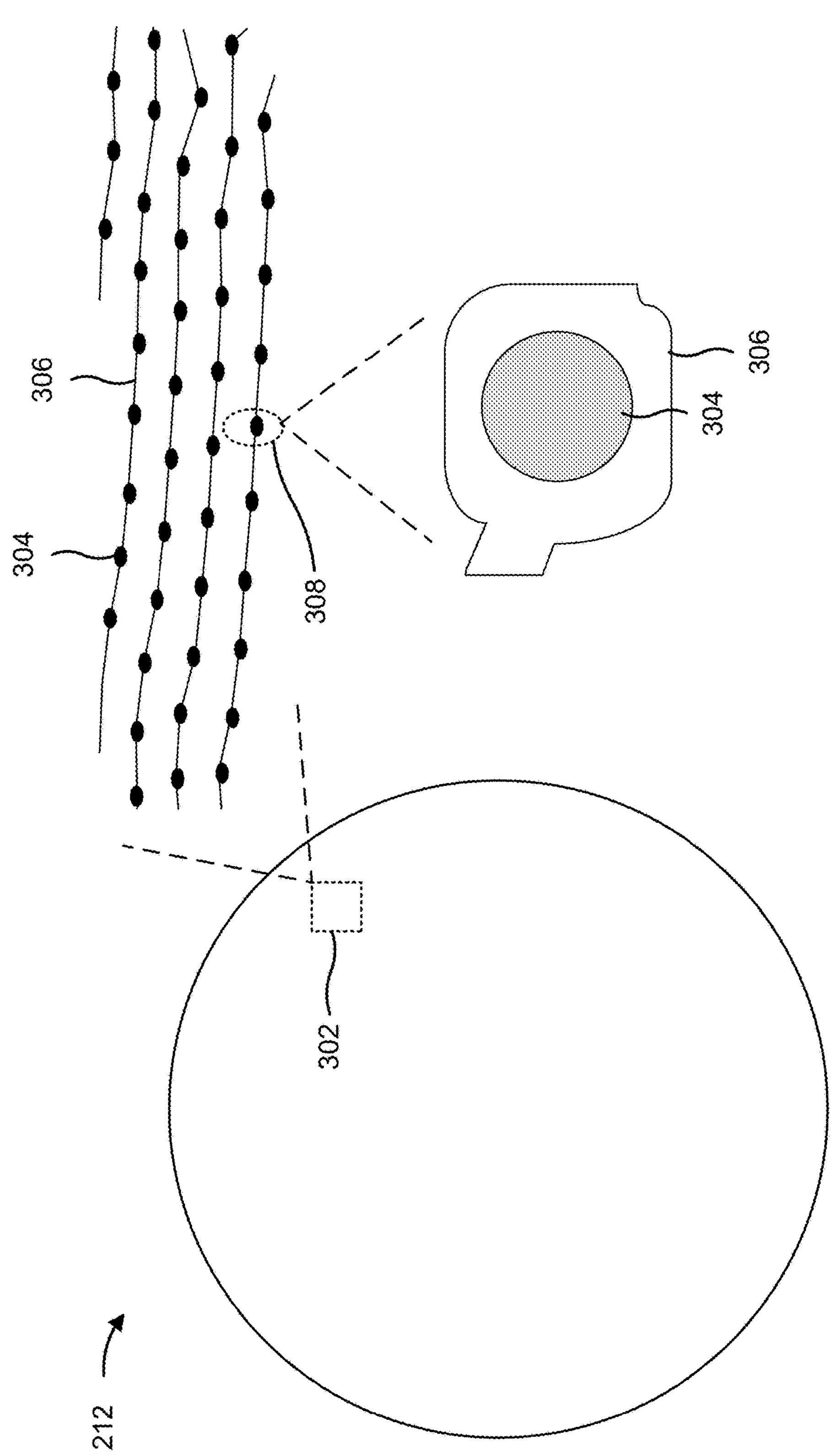
FIG. 3 is a diagram of an example wafer table described herein for use in the bottom module of FIG. 2.

FIG. 3 is a diagram of an example wafer table 212 described herein for use in the bottom module 138 of FIG. 2. The wafer table 212 includes a substantially flat and planar top surface on which a semiconductor substrate 110 is configured to be supported. As shown in a close-up view 302 of the top of the wafer table 212, the top surface includes an array of projections that are referred to as surface burls 304. The surface burls 304 protrude from the top surface of the wafer table 212 and extend above the top surface of the wafer table 212. The surface burls 304 are configured to enable a semiconductor substrate 110 to be placed on the wafer table 212 such that the semiconductor substrate 110 rests on the surface burls 304. The surface burls 304 provide a gap between the bottom surface of the semiconductor substrate 110 and the top surface of the wafer table 212. By positioning the semiconductor substrate 110 on the surface burls 304, particles and/or other contaminants that may be located on the top surface of the wafer table 212 have less of an effect on flatness of the semiconductor substrate 110.

The wafer table 212 includes a plurality of surface burls 304, ranging in the thousands of surface burls 304 to tens of thousands of surface burls 304 or more. As an example, the wafer table 212 may include 20,000 surface burls 304, 30,000 surface burls 304, or a greater quantity of surface burls 304. The large quantity of surface burls 304 provides a large quantity of touch points for the semiconductor substrate 110, which reduces the stress and flexing of the semiconductor substrate 110. The surface burls 304 may be approximately evenly spaced on the top surface of the wafer table 212, may be unevenly spaced on the top surface of the wafer table 212, or a combination thereof. The surface burls 304 may be electrically connected by grounding wires 306 (or grounding traces) to reduce the transfer and/or discharge of electrical charges on the semiconductor substrate 110.

As shown in another close-up view 308 in FIG. 3, the surface burls 304 may include an approximately round shape. In other implementations, the surface burls 304 include an approximately square shape, an approximately triangular shape, a polygonal shape, another shape, or a combination of shapes. The grounding wires 306 surround the surface burls 304 and are configured to remove build-ups of electrical charges on the surface burls 304 so that the electrical charges are not transferred to the semiconductor substrate 110 through the surface burls 304 when the semiconductor substrate 110 is placed on the surface burls 304.

As indicated above, FIG. 3 is provided as an example. Other examples may differ from what is described with regard to FIG. 3.

Figure 4:
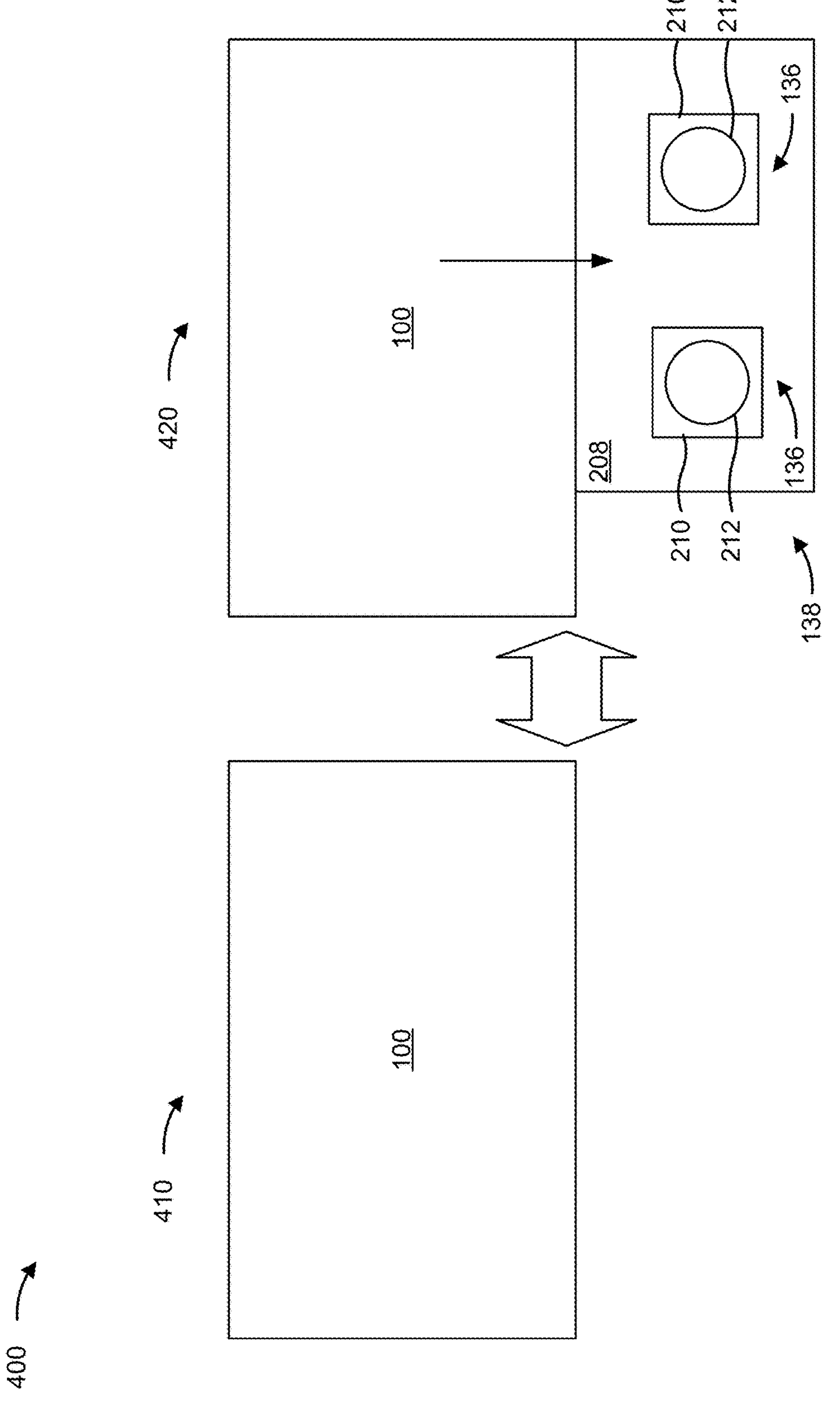
FIG. 4 is a diagram of an example implementation described herein.

FIG. 4 is a diagram of an example implementation 400 described herein. The example implementation 400 includes an example of removal of the bottom module 138 from the lithography system 100 (particularly the exposure tool 104) for cleaning of the wafer table(s) 212, for inspection of the wafer table(s) 212, and/or for other purposes.

As shown in FIG. 4, the lithography system 100 may transition between an assembled configuration 410 and a disassembled configuration 420 in which the bottom module 138 is at least partially removed from the lithography system 100. To transition the lithography system 100 from the assembled configuration 410 to the disassembled configuration 420, the bottom module 138 may slide out from the exposure tool 104, may roll out of the exposure tool 104, and/or may otherwise be removed from the exposure tool 104. The bottom module 138 may slide or roll on wheels, castors, rollers, or other components. If the lithography system 100 is pressurized to a vacuum (or a partial vacuum), the lithography system 100 may be vented such that the vacuum is removed prior to removing the bottom module 138 from the lithography system 100.

In the disassembled configuration 420, one or more of the wafer tables 212 may be cleaned in one or more cleaning operations, one or more of the wafer tables 212 may be inspected, one or more of the wafer tables 212 may be replaced, and/or one or more other operations may be performed in connection with the wafer tables 212 and/or other components of the bottom module 138.

The lithography system 100 may be assembled (or re-assembled) transitioning the lithography system 100 from the disassembled configuration 420 to the assembled configuration 410. To transition the lithography system 100 from the disassembled configuration 420 to the assembled configuration 410, the bottom module 138 may slide into a bottom portion of the exposure tool 104, may roll into a bottom portion of the exposure tool 104, and/or may otherwise be positioned into a bottom portion of the exposure tool 104. The lithography system 100 may be calibrated and pumped down to a vacuum (or partial vacuum) for an exposure operation.

As indicated above, FIG. 4 is provided as an example. Other examples may differ from what is described with regard to FIG. 4.

Figure 5:
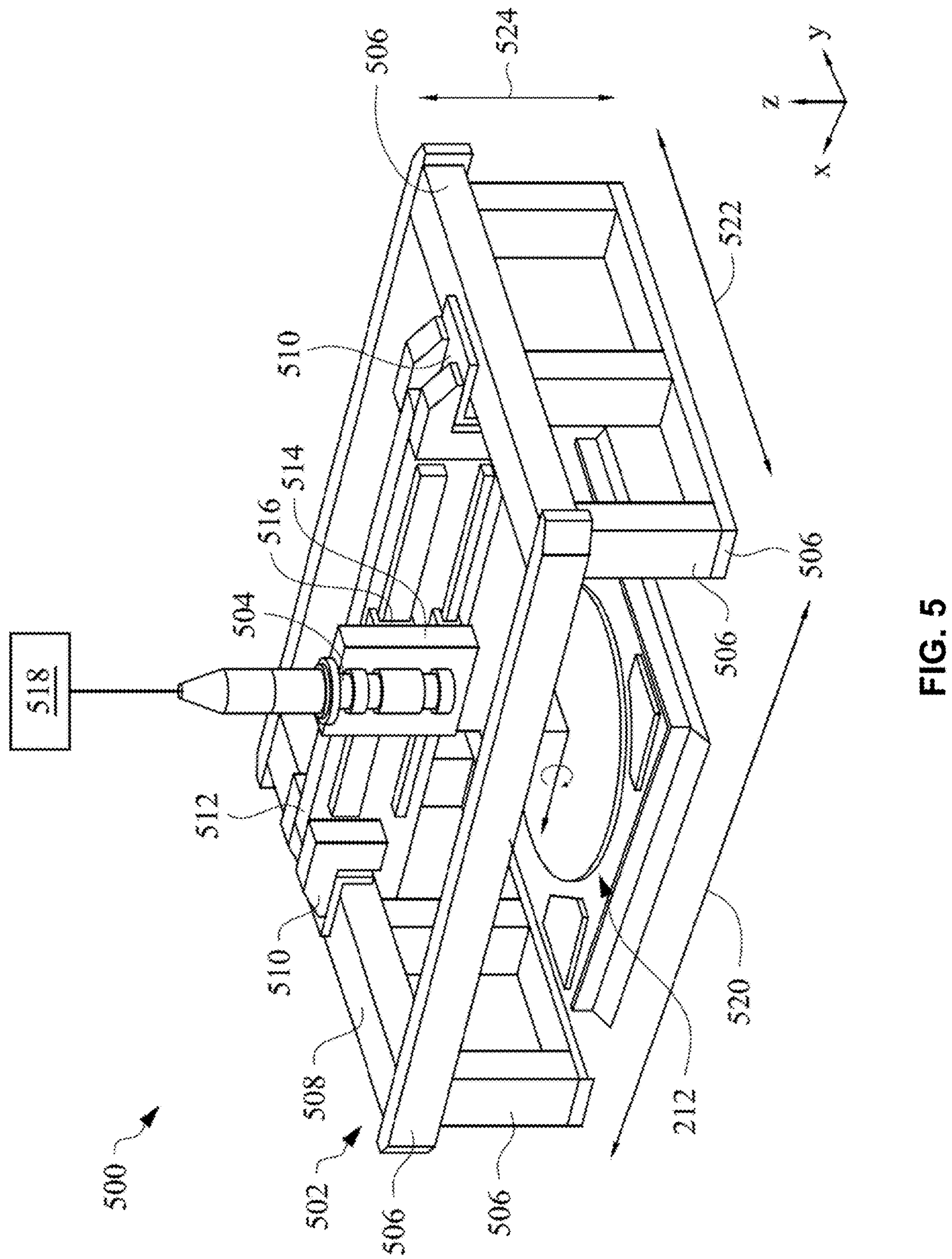
FIG. 5 is a diagram of an example wafer table inspection tool described herein.

FIG. 5 is a diagram of an example wafer table inspection tool 500 described herein. The wafer table inspection tool 500 is configured to inspect a wafer table 212 of the lithography system 100. For example, the wafer table inspection tool 500 is configured to inspect the surface burls 304 of the wafer table 212 to determine and/or verify the cleaning performance of a cleaning operation to clean the surface burls 304, to determine surface wear condition of the surface burls 304 (e.g., an amount of wear on the surface burls 304), and/or to determine other one or more properties and/or parameters associated with the surface burls 304.

As shown in FIG. 5, the wafer table inspection tool 500 includes a support frame 502 that is configured to secure and/or support an inspection device 504 of the wafer table inspection tool 500. The support frame 502 is further configured to be positioned around and/or over the wafer table 212. In particular, the support frame 502 is configured to be positioned around and/or over the wafer table 212 while the wafer table 212 is located in the bottom module 138. In this way, the wafer table inspection tool 500 is capable of inspecting the wafer table 212 without removal of the wafer table 212 from the bottom module 138, and while the bottom module 138 is at least partially removed from the exposure tool 104 (e.g., when the lithography system 100 is in the disassembled configuration 420).

In some implementations, the wafer table inspection tool 500 (e.g., the support frame 502 of the wafer table inspection tool 500) is configured to be placed or positioned on the balance mass 208 around and/or over the wafer table 212. In some implementations, the wafer table inspection tool 500 (e.g., the support frame 502 of the wafer table inspection tool 500) is configured to be placed or positioned on the wafer stage 136 around and/or over the wafer table 212. The wafer table inspection tool 500 may be positioned relative to the wafer table 212 such that the wafer table 212 is within the field of view of the inspection device 504.

The inspection device 504 includes one or more image sensor devices (e.g., charge coupled devices (CCDs), complementary metal oxide semiconductor (CMOS) image sensors), one or more camera devices (e.g., devices that include a combination of an image sensor device and an image processor), and/or one or more other types of devices that are capable of generating image sensor data based on scanning the top surface of the wafer table 212 and/or based on scanning the surface burls 304 of the wafer table 212.

The support frame 502 may be formed of various materials, including metals (e.g., steel, aluminum, titanium, an alloy, and/or a combination thereof), plastics, resins, composite materials, carbon fibers, and/or other types of materials. The support frame 502 includes a plurality of support members 506. The support members 506 include elongated members that extend in one or more axes, including the x-axis shown in FIG. 5, the y-axis shown in FIG. 5, and/or the z-axis shown in FIG. 5. The support members 506 may be extruded, forged, rolled, casted, and/or formed by other manufacturing techniques. The support frame 502 may include additional components, such as fasteners (e.g., screws, rivets), brackets, plates, gusset plates, and/or other structural components.

The wafer table inspection tool 500 includes a plurality of guide rails 508 that extend in and/or along a first axis (e.g., the y-axis shown in FIG. 5). The guide rails 508 permit the inspection device 504 to be moved or displaced over the wafer table 212 along the first axis. The guide rails 508 include toothed or notched tracks, smooth rails, drive screws, and/or similar types of structures. The guide rails 508 interface with a plurality of motors 510. Each guide rail 508 may interface with a respective motor 510. The motors 510 may include servo motors, stepper motors, brushless motors, and/or other types of motors. The motors 510 may be further coupled to a guide rail 512 and may be configured to move or displace the guide rail 512 (and thus, the inspection device 504) along the guide rails 508 in and/or along the first axis.

The guide rail 512 extends in and/or along a second axis (e.g., the x-axis shown in FIG. 5). The first axis and the second axis are approximately perpendicular. The guide rail 512 permits the inspection device 504 to be moved or displaced over the wafer table 212 along the second axis. In this way, the combination of the guide rails 508 and the guide rail 512 enable two-axis movement of the inspection device 504 (e.g., enable movement of the inspection device 504 in at least two axes to enable inspection of the surface burls 304 on the wafer table 212).

The guide rail 512 includes toothed or notched tracks, smooth rails, drive screws, and/or similar types of structures. The guide rail 512 interfaces with a motor 514. The motor 514 may include a servo motor, a stepper motor, a brushless motor, and/or another type of motor. The motor 514 may be further coupled to a bracket 516 that is configured to secure the inspection device 504 to the support frame 502. The motor 514 is configured to move or displace the bracket 516 (and thus, the inspection device 504) along the guide rail 512 in and/or along the second axis.

As further shown in FIG. 5, the wafer table inspection tool 500 includes a controller 518 (e.g., a processor, a combination of a processor and a memory, a system on chip (SoC), a programmable logic controller (PLC), and/or another type of controller). The controller 518 is configured to control the operation of the wafer table inspection tool 500 by transmitting signals to various components of the wafer table inspection tool 500, such as the inspection device 504, the motors 510, and/or the motor 514, among other examples. Moreover, the controller 518 may receive data from the inspection device 504, and the controller 518 may control the wafer table inspection tool 500 based on the received data. In some implementations, the controller 518 transmits one or more signals to the motors 510 and/or the motor 514 to cause the motors 510 and/or the motor 514 to move the inspection device 504 relative to the wafer table 212. In some implementations, the controller 518 transmits one or more signals to the inspection device 504 to cause the inspection device 504 to generate image sensor data. In some implementations, the controller 518 receives the image sensor data from the inspection device 504 and determines a surface wear condition of the surface burls 304, determines a cleaning performance of a cleaning operation associated with the surface burls 304, and/or performs one or more other actions based on the image sensor data.

The controller 518 communicates with the inspection device 504, the motors 510, and/or the motor 514 over wired and/or wireless connections. While the controller 518 is illustrated as being located remotely from the inspection device 504, the controller 518 may be co-located with the inspection device 504 (e.g., in the same housing, in the same device, on the same SoC or integrated circuit, on the same die, among other examples).

As further shown in FIG. 5, the wafer table inspection tool 500 may include one or more dimensions. The wafer table inspection tool 500 may include a width dimension 520 (e.g., in and/or along the x-axis shown in FIG. 5). In some implementations, the width dimension 520 is included in a range of approximately 800 millimeters to approximately 1200 millimeters to permit the inspection device 504 to fully traverse the diameter or width of the wafer table 212 in and/or along the x-axis while permitting the wafer table inspection tool 500 to fit on the bottom module 138. However, other values for the width dimension 520 are within the scope of the present disclosure.

The wafer table inspection tool 500 may include a depth dimension 522 (e.g., in and/or along the y-axis shown in FIG. 5). In some implementations, the depth dimension 522 is included in a range of approximately 600 millimeters to approximately 1000 millimeters to permit the inspection device 504 to fully traverse the diameter or width of the wafer table 212 in and/or along the y-axis while permitting the wafer table inspection tool 500 to fit on the bottom module 138. However, other values for the depth dimension 522 are within the scope of the present disclosure.

The wafer table inspection tool 500 may include a height dimension 524 (e.g., in and/or along the z-axis shown in FIG. 5). In some implementations, the height dimension 524 is included in a range of approximately 200 millimeters to approximately 400 millimeters to enable the full wafer table 212 (or the portion of the wafer table 212 on which a semiconductor substrate 110 is to occupy) to be captured within the field of view of the inspection device 504 while providing sufficient structural rigidity and stiffness for the support frame 502 to enable accurate image sensor data generation. However, other values for the height dimension 524 are within the scope of the present disclosure.

In some implementations, a distance between the inspection device 504 and a top surface of the wafer table 212 is included in a range of approximately 70 millimeters to approximately 300 millimeters to enable the full wafer table 212 (or the portion of the wafer table 212 on which a semiconductor substrate 110 is to occupy) to be captured within the field of view of the inspection device 504 while enabling sufficient granularity and image quality for the image sensor data generated by the inspection device 504. However, other values for the distance are within the scope of the present disclosure.

As indicated above, FIG. 5 is provided as an example. Other examples may differ from what is described with regard to FIG. 5.

Figures 6A, 6B:
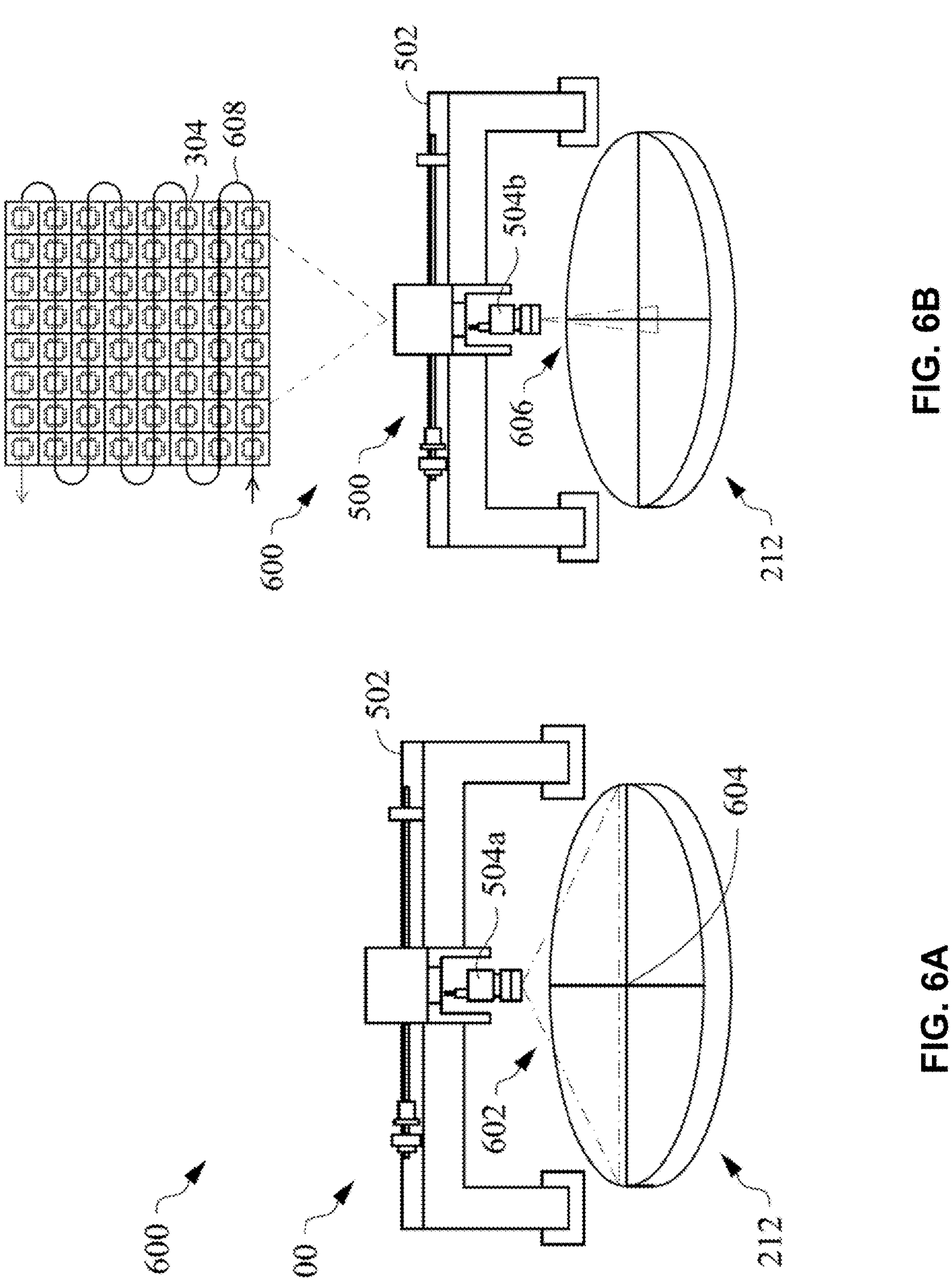
FIGS. 6A, 6B, and 7A-7G are diagrams of example implementations described herein.

FIGS. 6A and 6B are diagrams of an example implementation 600 described herein. The example implementation 600 includes an example of inspecting a wafer table 212 using the wafer table inspection tool 500. As shown in FIGS. 6A and 6B, the wafer table inspection tool 500 is positioned over and/or around the wafer table 212 for inspecting the wafer table 212 (or the surface burls 304 included on the wafer table 212).

As shown in FIG. 6A, a first camera device (or image sensor device) **504*a* of the inspection device 504 performs a first scan 602 of the wafer table 212. The first scan 602 includes a wide angle scan of the entire wafer table 212 (or the portion of the wafer table 212 in which the surface burls 304 are located). The first scan 602 may be referred to as a location scan or a zeroing scan in that the first camera device 504*a* performs the first scan 602 to enable the controller 518 to determine, locate, and/or zero in on a center (or center point) 604 of the wafer table 212**.

As shown in FIG. 6B, a second camera device (or image sensor device) **504*b* of the inspection device 504 performs a plurality of second scans 606 of the wafer table 212. The second scans 606 may be referred to as inspection scans or surface burl scans in that the second scans 606 are performed to scan individual surface burls 304 (or groups or a plurality of surface burls 304 per second scan 606) to enable the controller 518 to inspect the surface burls 304 based on the second scans 606. In some implementations, the first camera device 504*a* and the second camera device 504*b* are separate camera devices. In some implementations, the first camera device 504*a* and the second camera device 504*b*** are the same camera device.

As further shown in FIG. 6B, the controller 518 may transmit one or more signals to the inspection device 504 (e.g., the second camera device **504*b*), to the motors 510, and/or to the motor 514 to cause the inspection device 504 (e.g., the second camera device 504*b*) to perform the second scans 606 in a scanning pattern 608. The one or more signals cause the inspection device 504 (e.g., the second camera device 504*b*) to step through each second scan 606 along the scanning pattern 608 to generate image sensor data for the surface burls 304. Each step in the scanning pattern 608 may include a second scan 606 of one or more surface burls 304. The controller 518 may receive the image sensor data for each second scan 606 and may generate images and/or videos of the surface burls 304** based on the image sensor data.

As shown in FIG. 6B, the scanning pattern 608 may include a snaking scanning pattern (or continuous raster scanning pattern). However, other scanning patterns may be used, including a raster scanning pattern (e.g., a zig-zag scanning pattern), a spiral scanning pattern, a diagonal scanning pattern, an orthogonal scanning pattern, and/or another type of scanning pattern.

In some implementations, the controller 518 determines the locations of the surface burls 304 based on the first scan 602. In particular, the controller 518 may determine calibration information based on image sensor data associated with the first scan 602. The calibration information may include information identifying coordinate offset information (e.g., an x-axis offset and a y-axis offset) or another type of coordinate information indicating coordinates of the center 604 of the wafer table 212 relative to a position of the wafer table inspection tool 212. The controller 518 may determine coordinates (e.g., x-axis and y-axis coordinates) for the locations of the surface burls 304 based on the calibration information and based on a mapping of the surface burls 304 on the wafer table 212. As an example, the mapping of the surface burls 304 on the wafer table 212 may indicate the locations of the surface burls 304 relative to a location of the center 604 of the wafer table. Accordingly, the controller 518 may generate calibrated coordinate pairs for each of the surface burls 304 (or subsets of the surface burls 304) by modifying the locations of the surface burls 304 based on the calibration information. The controller 518 may generate the scanning pattern 608 to include the calibrated coordinate pairs for the surface burls 304 and a particular order in which the second camera device 504*b* is to be traversed from surface burl 304 to surface burl 304. The controller 518 may transmit signals to the motors 510 and/or the motor 514 to cause the motors 510 and/or the motor 514 to move the second camera device 504*b* in the scanning patter 610 based on the calibrated coordinate pairs.

As indicated above, FIGS. 6A and 6B are provided as an example. Other examples may differ from what is described with regard to FIGS. 6A and 6B.

FIGS. 7A-7G are diagrams of an example implementation 700 described herein. The example 700 includes another example of inspecting a wafer table 212 using the wafer table inspection tool 500.

Figure 7A:
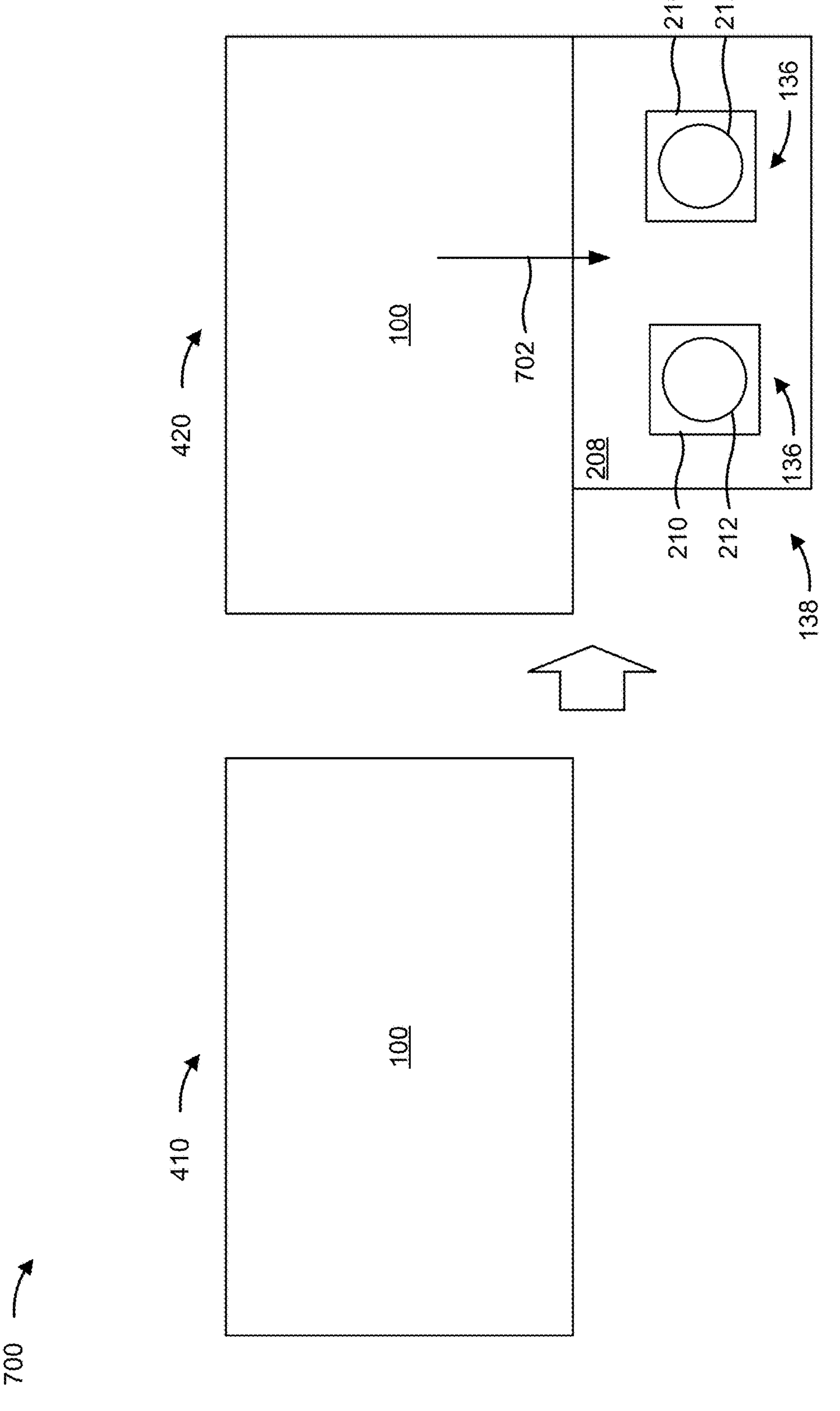

As shown in FIG. 7A, the lithography system 100 is transitioned from the assembled configuration 410 to the disassembled configuration 420. As further shown in FIG. 7A, the bottom module 138 is at least partially removed from the lithography system 100 (e.g., from the exposure tool 104 of the lithography system 100). Transitioning the lithography system 100 from the assembled configuration 410 to the disassembled configuration 420 provides access to the wafer stage(s) 136 and the wafer table(s) 212 included in the bottom module 138.

The lithography system 100 may be transitioned from the assembled configuration 410 to the disassembled configuration 420 to enable cleaning and/or inspection of one or more wafer tables 212 in the bottom module 138. In some implementations, a wafer table 212 is cleaned and/or inspected based on a service schedule or maintenance schedule for the wafer table 212 and/or for the lithography system 100. For example, the wafer table 212 may be cleaned and/or inspected at approximately 4 week intervals to approximately 6 week intervals to maintain sufficient performance for the wafer table 212. However, other service schedules or maintenance schedules are within the scope of the present disclosure.

In some implementations, a wafer table 212 is cleaned and/or inspected based on one or more performance parameters associated with the lithography system 100, one or more performance parameters associated with the exposure tool 104, and/or one or more performance parameters associated with the wafer table 212. For example, the controller 518 or another controller included in the lithography system 100 may determine to clean and/or inspect a wafer table 212 based on determining or detecting an increasing size and/or increasing quantity of hot spots on semiconductor substrates 110 that are exposed by the exposure tool 104 (which may be an indication that the flatness of the wafer table 212 is decreasing). As another example, the controller 518 or another controller included in the lithography system 100 may determine to clean and/or inspect a wafer table 212 based on determining that a size of a hot spot on a semiconductor substrate 110 that is exposed by the exposure tool 104 satisfies a threshold. As another example, the controller 518 or another controller included in the lithography system 100 may determine to clean and/or inspect a wafer table 212 based on determining that a quantity of hot spots on a semiconductor substrate 110 that are exposed by the exposure tool 104 satisfies a threshold.

Figure 7B:
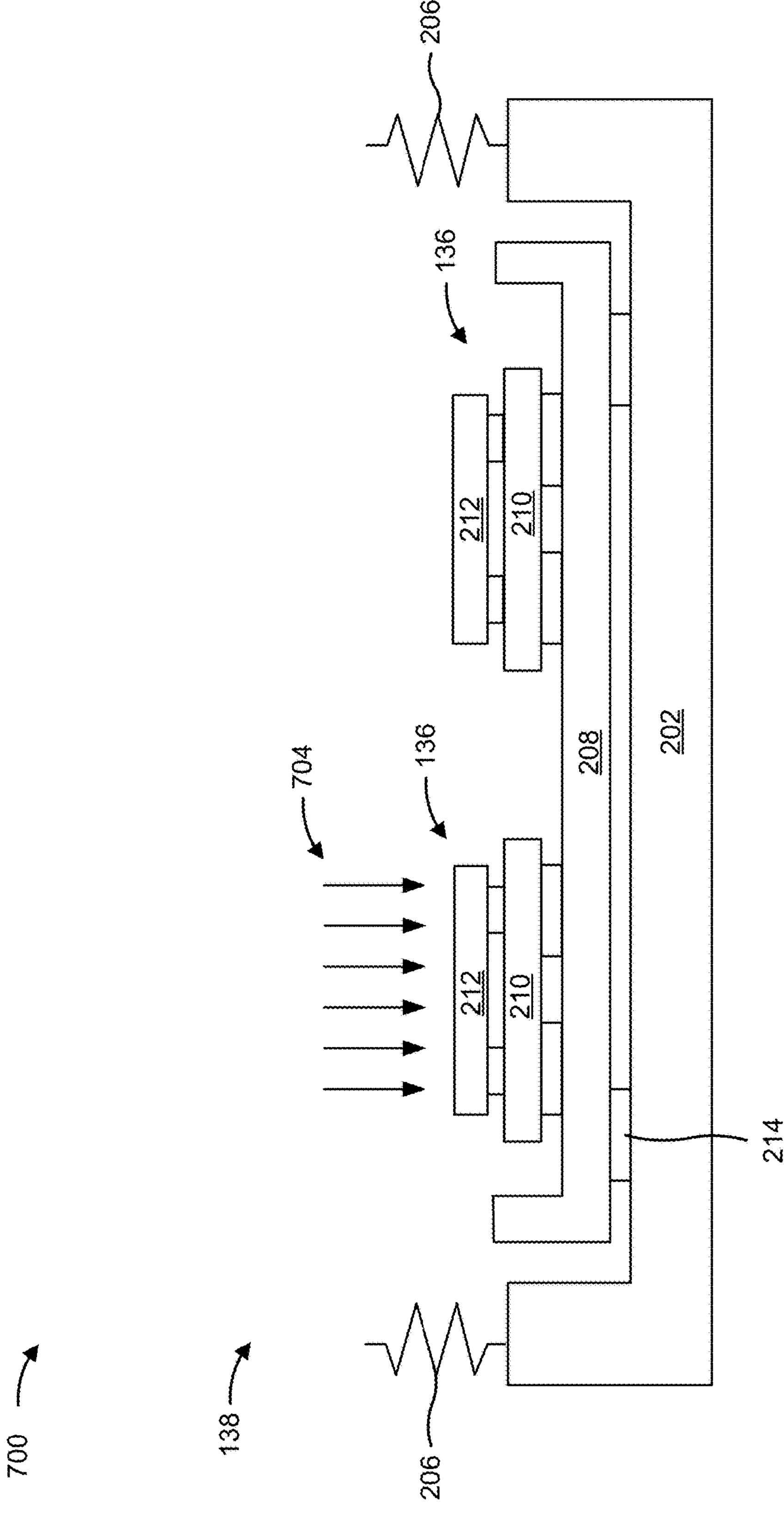

As shown in FIG. 7B, a cleaning operation 704 is performed for a wafer table 212 included in the bottom module 138. The wafer table 212 may be cleaned while the wafer table 212 (and the associated wafer stage 136) is included in the bottom module 138 (e.g., without removing the wafer table 212 and/or the wafer stage 136 from the bottom module 138). The cleaning operation 704 may include cleaning the surface burls 304 of the wafer table 212 (e.g., manually by maintenance personnel and/or automatically by an automated cleaning tool). The cleaning operation 704 may include cleaning the surface burls 304 with a brush, with a cleaning towel, with one or more types of cleaning chemicals, and/or with one or more other types of cleaning tools.

Figure 7C:
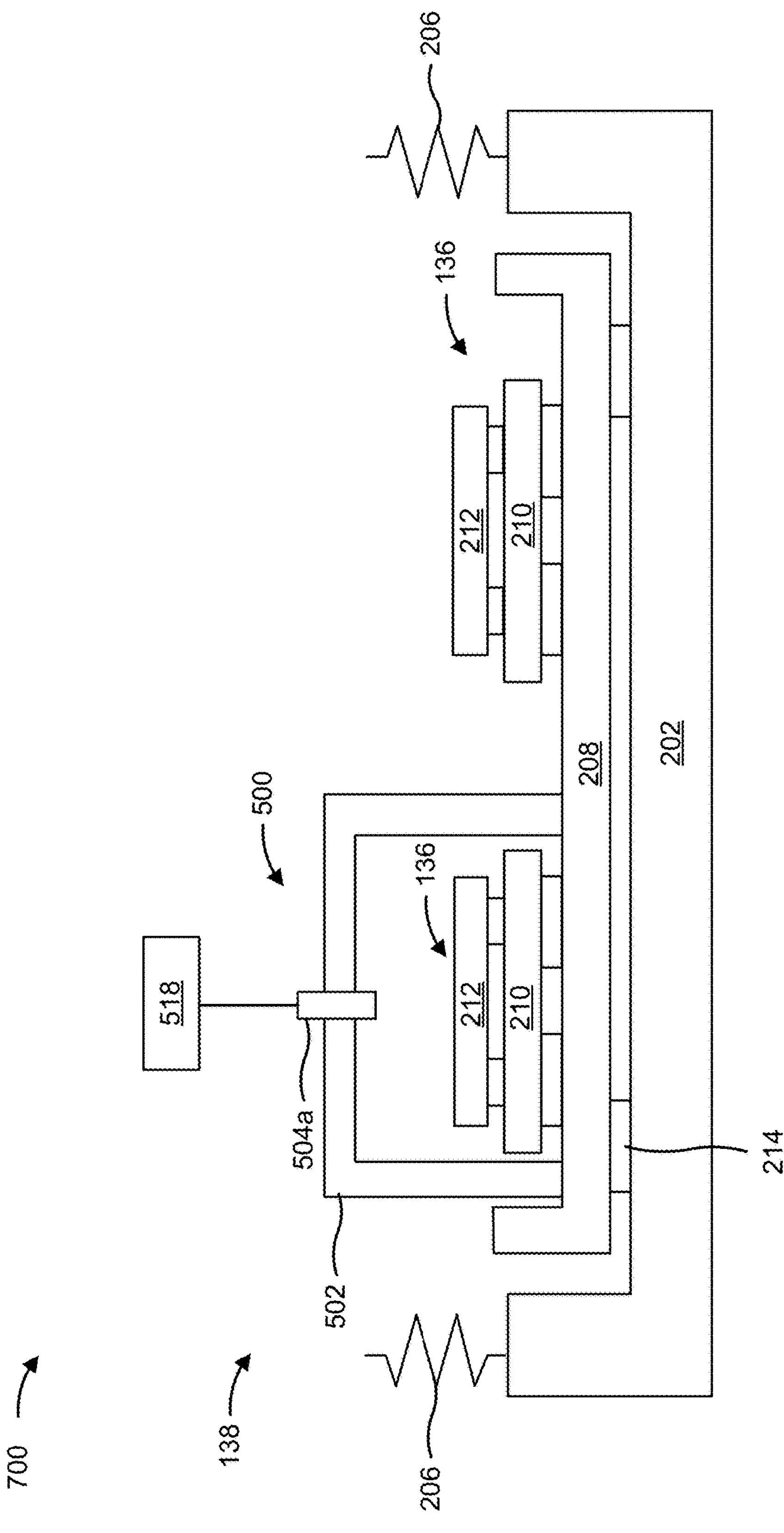

As shown in FIG. 7C, the wafer table inspection tool 500 may be positioned over the wafer table 212. In some implementations, the wafer table inspection tool 500 is positioned over the wafer table 212 after the cleaning operation 704 to inspect and/or verify a cleaning performance of the cleaning operation 704 and/or to determine a wear condition of the wafer table 212 after the cleaning operation 704. In some implementations, the wafer table inspection tool 500 is positioned over the wafer table 212 by maintenance personnel. In some implementations, the wafer table inspection tool 500 is automatically positioned over the wafer table 212.

Alternatively, the wafer table 212 may be a "new" wafer table 212 (e.g., a wafer table 212 that is unused in the lithography system 100 and/or is installed in the bottom module 138 for the first time). In these implementations, the lithography system 100 is transitioned to the disassembled configuration 420 to replace another wafer table 212 in the bottom module 138 with the "new" wafer table 212 or to add the "new" wafer table 212 to the bottom module 138 if no wafer table 212 is installed in the bottom module 138. The wafer table inspection tool 500 is positioned over the wafer table 212 prior to a first use of the wafer table 212 in the lithography system 100 (with or without first performing the cleaning operation 704) to inspect the wafer table 212 to establish a baseline condition of the wafer table 212 and/or to perform an acceptance test on the wafer table 212 (e.g., to verify whether the wafer table 212 is in sufficient condition to be placed into production use in the lithography system 100).

As further shown in FIG. 7C, the support frame 502 of the wafer table inspection tool 500 may be positioned on the balance mass 208. Alternatively, the support frame 502 of the wafer table inspection tool 500 may be positioned on the base frame 202, on the chuck 210 of the wafer stage 136, and/or on another surface in the bottom module 138.

Figure 7D:
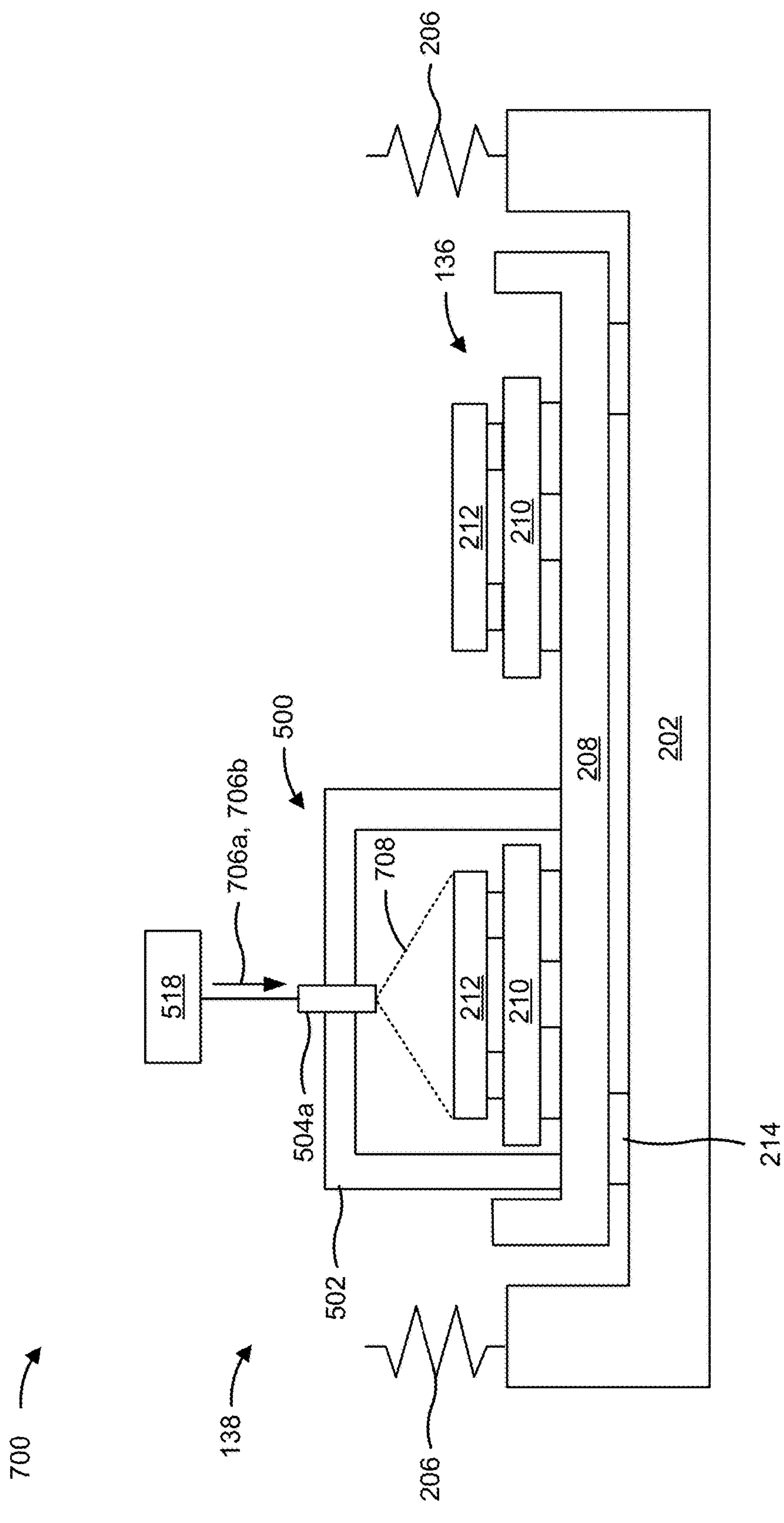
Figure 7E:
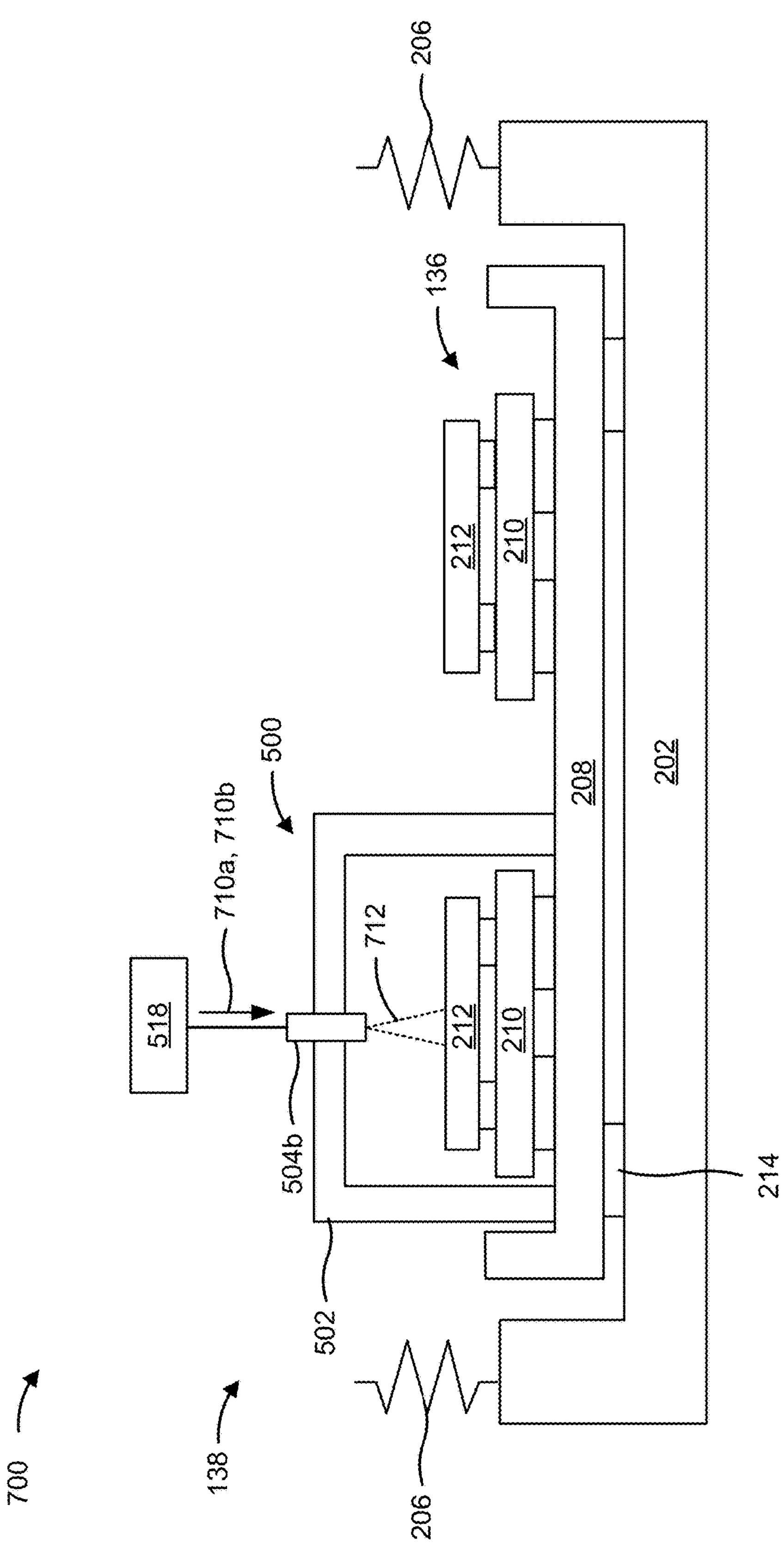
Figure 7F:
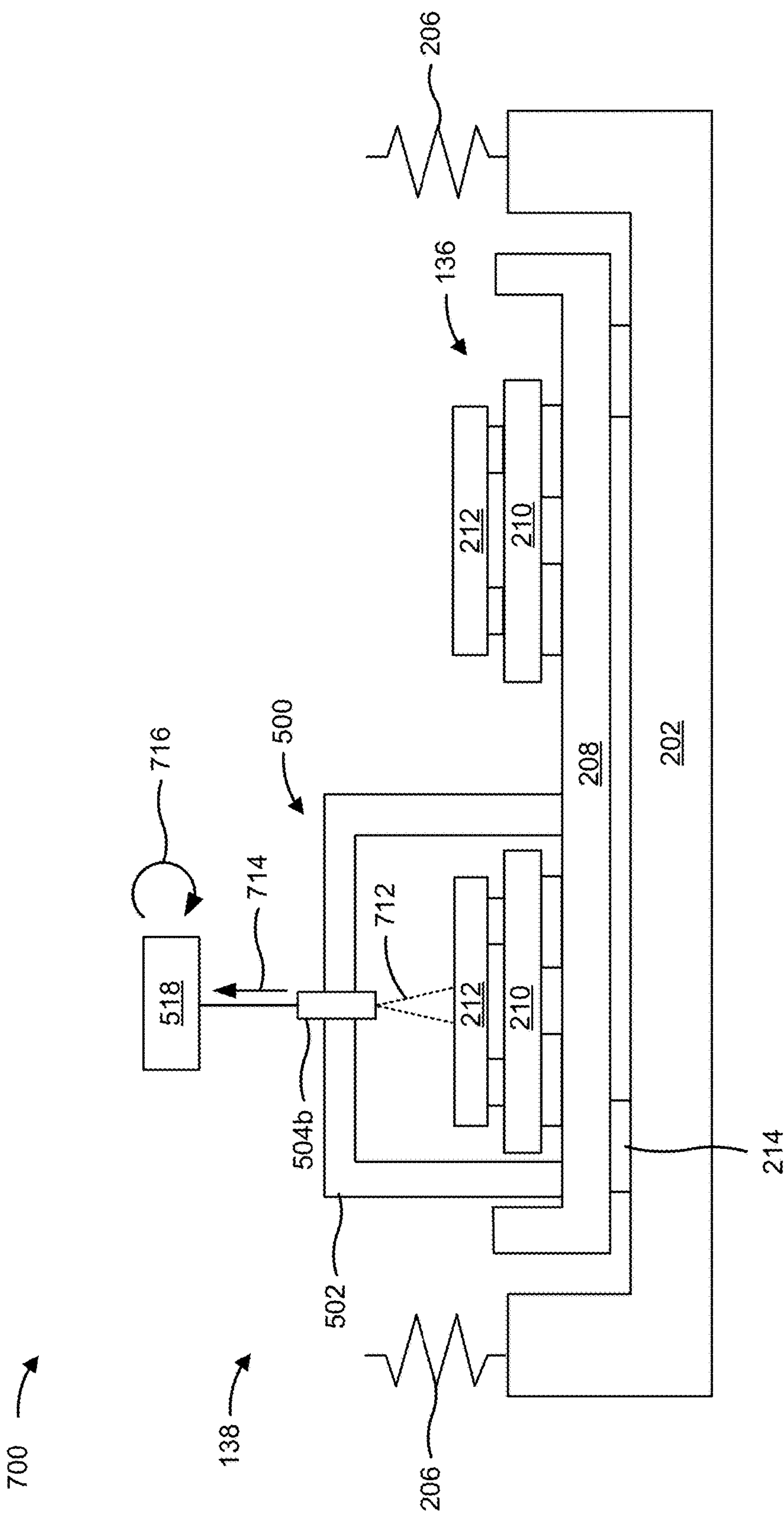

As shown in FIGS. 7D-7F, an inspection of the wafer table 212 may be performed. The inspection may be performed by and/or using the inspection device 504 of the wafer table inspection tool 500 while the bottom module 138 is at least partially removed from the exposure tool 104 and while the wafer table 212 and the wafer stage 136 are in the bottom module 138. Accordingly, the inspection is performed while the wafer table 212 is at atmospheric pressure (and in other atmospheric conditions) in the environment in which the lithography system 100 is located.

As shown in FIG. 7D, the controller 518 may transmit one or more signals 706*a* to cause the motors 510 and/or the motor 514 to position the inspection device 504 over the wafer table 212. The controller 518 may transmit one or more signals 706*b* to cause the first camera device 504*a* of the inspection device 504 to perform a scan 708 (e.g., a wide angle scan such as the scan 602) the top surface of the wafer table 212 and to generate image sensor data based on scanning the top surface of the wafer table 212. The image sensor data may associated with a location of the wafer table 212 and may include images, recorded video, streaming video, and/or another type of image sensor data.

The controller 518 may receive the image sensor data from the first camera device 504*a*, may determine a location of the wafer table 212 based on the image sensor data, and/or may determine that the inspection device 504 is positioned over the wafer table 212. In particular, the controller 518 may identify or determine a location of the center (or a center point) 604 of the wafer table 212 based on the image sensor data, may identify the edge or perimeter of the wafer table 212 (or the edge or perimeter of a portion of the wafer table 212 that is configured to support a semiconductor substrate 110), and may determine that the inspection device 504 is positioned over the wafer table 212 based on determining that the center 604 of the wafer table 212 and the edge or perimeter of the wafer table 212 are within the field of view of the second camera device 504*b*.

In some implementations, the controller 518 transmits the signal(s) 706*a* to the motors 510 and/or the motor 514 to position the inspection device 504 over the wafer table 212 based on the image sensor data received from the first camera device 504*a*. For example, the controller 518 may receive streaming video from the first camera device 504*a* and may transmit the signal(s) 706*a* to adjust the position of the inspection device 504 until the controller 518 determines that the center 604 of the wafer table 212 and the edge or perimeter of the wafer table 212 are within the field of view of the second camera device 504*b*.

As shown in FIG. 7E, the controller 518 transmits a plurality of signals 710*a* to the motors 510 and/or the motor 514 to cause the motors 510 and/or the motor 514 to move the inspection device 504 (and thus, the second camera device 504*b*) along a scanning pattern 608. Moreover, the controller 518 transmits a plurality of signals 710*b* to cause the second camera device 504*b* to perform a plurality of scans 712 (e.g., scans 606, surface burl scans, inspection scans) to inspect the plurality of surface burls 304 on the wafer table 212 while the motors 510 and/or the motor 514 to move the second camera device 504*b* along a scanning pattern 608.

In some implementations, the controller 518 automatically transmits the signals 710*a* and/or the signals 710*b* based on determining that the inspection device 504 is positioned over the wafer table 212. In some implementations, the controller 518 transmits the signals 710*a* and/or the signals 710*b* based on receiving input to transmit the signals 710*a* and/or the signals 710*b*.

As shown in FIG. 7F, the second camera device 504*b* generates image sensor data 714 based on the scans 712 and provides the image sensor data 714 to the controller 518. The controller 518 receives the image sensor data 714 from the second camera device 504*b* (and thus, from the inspection device 504).

As shown by reference number 716, the controller 518 generates images (e.g., inspection images) for the surface burls 304 based on the image sensor data. In some implementations, the second camera device 504*b* generates respective image sensor data 714 for each of the surface burls 304. In these implementations, the controller 518 generates respective images (e.g., respective inspection images) for each of the surface burls 304. In some implementations, the second camera device 504*b* generates image sensor data 714 for subsets of the surface burls 304 (e.g., subsets including respective pluralities of the surface burls 304). In these implementations, the controller 518 generates images (e.g., inspection images) for each of the subsets of the surface burls 304.

The controller 518 determines, based on the images (e.g., the inspection images), whether a performance of the cleaning operation 704 satisfies one or more performance thresholds and/or determines a surface wear condition of the surface burls 304. In some implementations, the controller 518 determines whether the performance of the cleaning operation 704 satisfies the one or more performance thresholds by determining whether one or more cleaning parameters of the cleaning operation 704 satisfy the one or more performance thresholds. As an example, the controller 518 may determine whether a surface roughness for the surface burls 304 satisfies a surface roughness threshold. As another example, the controller 518 may determine whether a flatness for the surface burls 304 satisfies a flatness threshold. As another example, the controller 518 may determine whether a reflectance for the surface burls 304 satisfies a reflectance threshold. As another example, the controller 518 may determine whether a combination of the above-identified cleaning parameters (or one or more other cleaning parameters) satisfies respective performance thresholds.

As indicated above, in some implementations, the wafer table 212 is a "new" wafer table 212, and the wafer table inspection tool 500 is positioned over the wafer table 212 prior to a first use of the wafer table 212 in the lithography system 100 to inspect the wafer table 212 to establish a baseline condition of the wafer table 212. In these implementations, the controller 518 generates baseline images of the surface burls 304 (e.g., based on image sensor data generated by and received from the second camera device 504*b*) to establish the baseline condition of the surface burls 304 on the wafer table 212.

The controller 518 may use the baseline images and the inspection images for various purposes associated with maintenance and cleaning of the wafer table 212. In some implementations, the controller 518 determines or adjusts a service schedule and/or maintenance schedule for the wafer table 212 based on the baseline images and the inspection images. For example, the controller 518 may increase a time duration between cleanings and inspection of the wafer table 212 based on determining that surface burls 304 are wearing slower than estimated, and/or based on determining that the cleanliness of the surface burls 304 decreases slower than estimated. As another example, the controller 518 may decrease a time duration between cleanings and inspection of the wafer table 212 based on determining that surface burls 304 are wearing faster than estimated, and/or based on determining that the cleanliness of the surface burls 304 decreases faster than estimated.

In some implementations, the controller 518 determines or adjusts an estimated service life (or an estimated remaining service life) for the wafer table 212 based on the baseline images and the inspection images. The estimated surface life may include a time duration (e.g., in hours of use, in hours of operation) after which the wafer table 212 is to be replaced. For example, the controller 518 may increase the estimated service life based on determining that surface burls 304 are wearing slower than estimated, or based on determining a rate of wear of the surface burls 304 is decreasing. As another example, the controller 518 may increase the estimated service life based on determining that surface burls 304 are wearing faster than estimated, or based on determining a rate of wear of the surface burls 304 is increasing.

In some implementations, the controller 518 determines whether the one or more cleaning performance parameters of the cleaning operation 704 satisfies the one or more performance thresholds. In these implementations, the controller 518 uses the baseline images as "golden" images (e.g., images of the ideal condition for the surface burls 304) and determines whether the one or more cleaning performance parameters of the cleaning operation 704 satisfies the one or more performance thresholds based on a comparison of the baseline images and the inspection images.

In some implementations, the controller 518 compares the baseline images and the inspection images and determines the cleaning performance of the cleaning operation 704, determines the estimated service life of the wafer table 212, determines the service schedule or maintenance schedule of the wafer table 212, and/or determines whether to replace the wafer table 212 based on the comparison.

In some implementations, the controller 518 uses a machine learning model to determine and/or verify the cleaning performance of the cleaning operation 704. Moreover, the controller 518 may use the machine learning model to determine the estimated service life of the wafer table 212, to determine or adjust the service schedule or maintenance schedule of the wafer table 212, to determine when to replace the wafer table 212, to determine when to perform the next cleaning operation for the wafer table 212, and/or to determine one or more other parameters associated with service and maintenance of the wafer table 212. In these implementations, the machine learning model may be trained on historical data from a plurality of (thousands, tens of thousands, or more) inspections of a plurality of wafer tables 212, historical baseline images, historical inspection images, and/or other historical data. The machine learning model may be trained and refined to determine the cleaning performance of the cleaning operation 704, to determine the estimated service life of the wafer table 212, to determine or adjust the service schedule or maintenance schedule of the wafer table 212, to determine when to replace the wafer table 212, to determine when to perform the next cleaning operation for the wafer table 212, and/or to determine one or more other parameters associated with service and maintenance of the wafer table 212. The baseline images associated with the wafer table 212, and the inspection images of the wafer table 212 after the cleaning operation 704 may be used as input to the machine learning model for determining the cleaning performance of the cleaning operation 704, for determining the estimated service life of the wafer table 212, for determining or adjusting the service schedule or maintenance schedule of the wafer table 212, for determining when to replace the wafer table 212, for determining when to perform the next cleaning operation for the wafer table 212, and/or for determining the one or more other parameters associated with service and maintenance of the wafer table 212. The output of the machine learning model may be used to update the machine learning model to improve the determination made using the machine learning model.

Figure 7G:
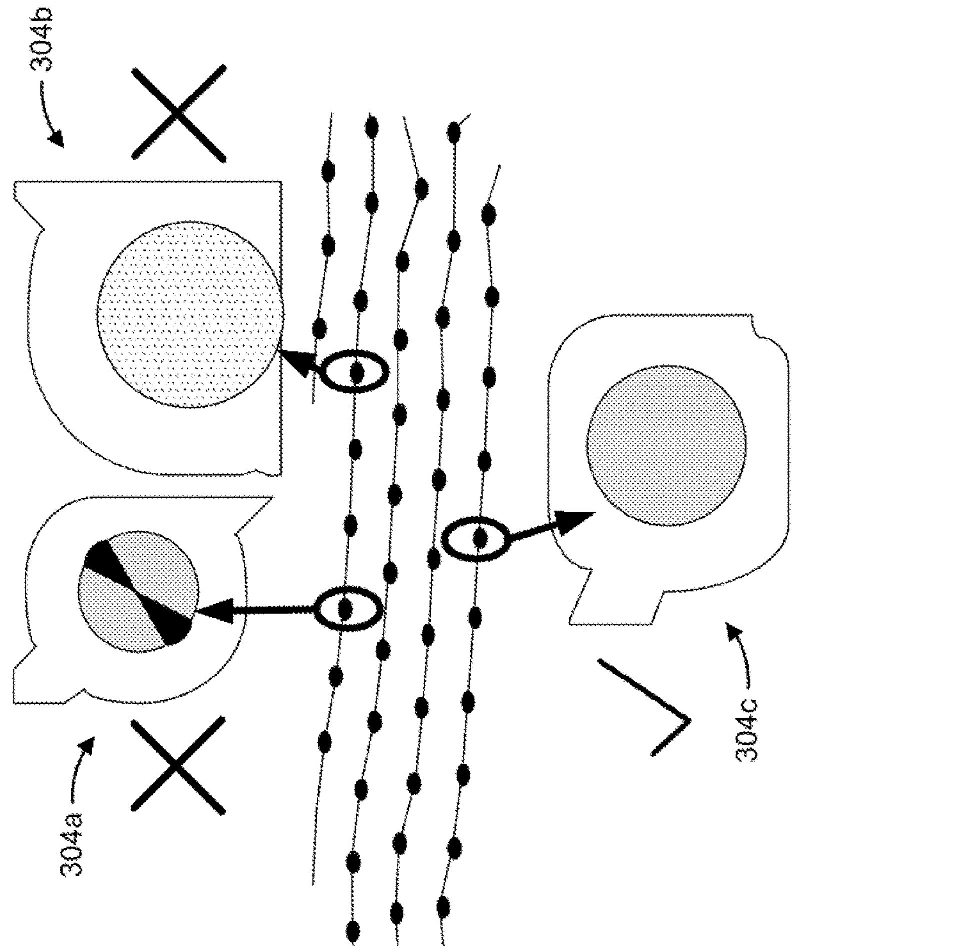

FIG. 7G illustrates examples of surface burls 304 in various cleaning conditions and/or surface wear conditions. As shown in FIG. 7G, an example surface burl 304*a* includes a surface burl 304 that includes uneven surface wear. The controller 518 may compare a baseline image of the surface burl 304*a* to an inspection image of the surface burl 304*a* to determine a surface wear condition for the surface burl 304*a*. The controller 518 may determine, based on the surface wear condition, that the surface burl 304*a* does not satisfy a flatness threshold, a surface roughness threshold, or another surface wear condition threshold. In some implementations, the controller 518 transmits a signal that causes a notification to replace the wafer table 212 to be displayed or outputted. In some implementations, the controller 518 determines whether the wafer table 212 is to be replaced based on a quantity or percentage of surface burls 304, including the surface burl 304*a*, for which an associated surface wear condition does not satisfy the one or more surface wear condition thresholds. In some implementations, the controller 518 updates a machine learning model for the wafer table 212 based on the surface wear condition for the surface burl 304*a* so that an updated service life estimation may be generated. In some implementations, the controller 518 performs one or more other actions based on determining that the surface wear condition for the surface burl 304*a* does not satisfy one or more surface wear condition threshold.

As further shown in FIG. 7G, another example surface burl 304*b* includes a surface burl 304 for which the controller 518 determines the performance of the cleaning operation 704 to be unsatisfactory. In some implementations, the controller 518 compares a baseline image of the surface burl 304*b* to an inspection image of the surface burl 304*b* to determine a surface roughness, a flatness, and/or a reflectance, among other examples, for the surface burl 304*b* (which may be indicators of the performance of the cleaning operation 704 for the surface burl 304*b*). In some implementations, the controller 518 performs one or more image processing techniques (e.g., boundary analysis, contrast analysis) to determine the surface roughness, the flatness, and/or the reflectance. The controller 518 may determine that the flatness does not satisfy a flatness threshold, that the surface roughness does not satisfy a surface roughness threshold, that the reflectivity does not satisfy a reflectivity threshold, and/or may determine that another cleaning performance parameter does not satisfy another cleaning performance threshold. In some implementations, the controller 518 may transmit a signal that causes a notification to perform another cleaning operation on the wafer table 212 to be displayed or outputted. In some implementations, the controller 518 transmits a signal to cause the other cleaning operation to be automatically performed (e.g., by an automated cleaning tool).

As further shown in FIG. 7G, another example surface burl 304*c* includes a surface burl 304 for which the controller 518 determines the performance of the cleaning operation 704 to be satisfactory and/or for which the controller 518 determines the surface wear condition to be satisfactory. The controller 518 may determine that the surface roughness of the surface burl 304*c* (e.g., the mean deviation of the assessed profile of the surface burl 304*c*) satisfies a surface roughness threshold. As an example, the controller 518 may determine that the surface roughness of the surface burl 304*c* is included in a range of approximately 2 nanometers to approximately 8 nanometers such that the evenness issues and/or hot spots for the wafer table 212 are minimized. In some implementations, the controller 518 determines that the surface roughness of the surface burl 304*c* is less than 2 nanometers.

In some implementations, the controller 518 generates an inspection report that indicates the outcome of the inspection of the plurality of surface burls 304. The inspection report may include, for example, an indication of whether the cleaning performance for each surface burl 304 was satisfactory, may include a percentage of satisfactory and/or unsatisfactory surface burls 304, and/or other information.

As indicated above, FIGS. 7A-7G are provided as one or more examples. Other examples may differ from what is described with regard to FIG. 7A-7G.

Figure 8:
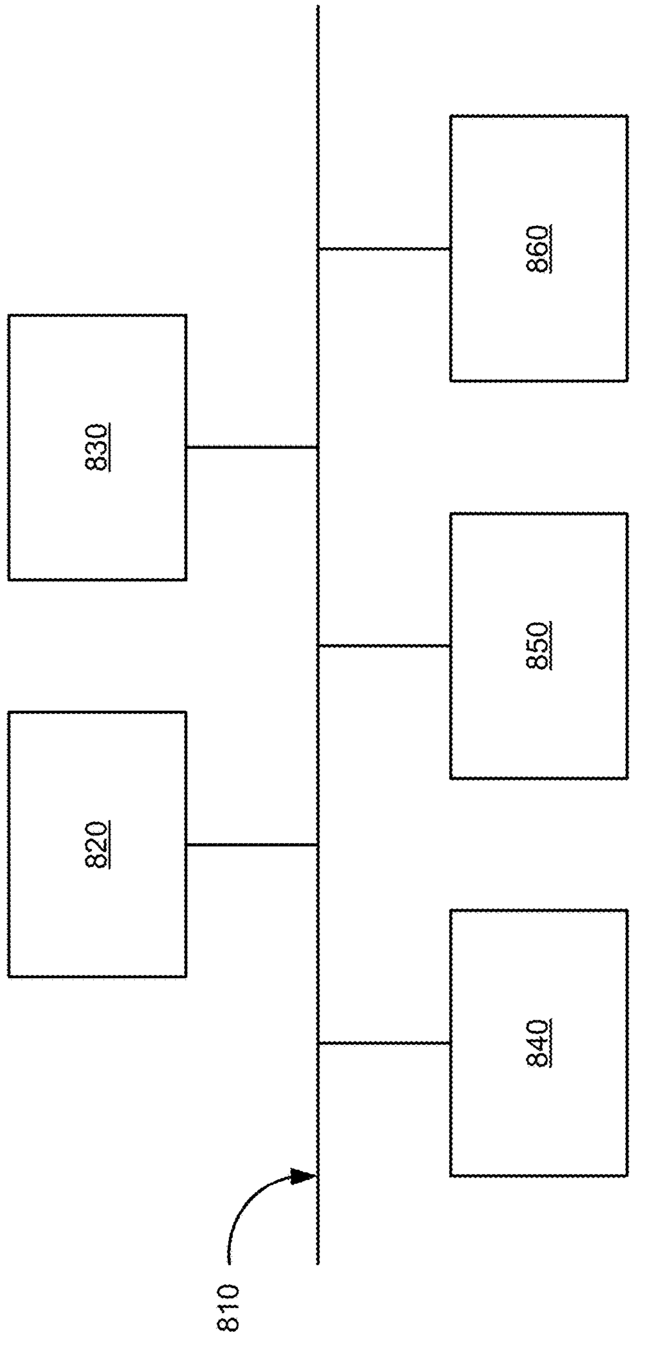
FIG. 8 is a diagram of example components of one or more devices of FIG. 1 described herein.

FIG. 8 is a diagram of example components of a device 800, which may correspond to the inspection device 504, the first camera device 504*a*, the second camera device 504*b*, the motors 510, the motors 514, the controller 518, and/or one or more components included in the lithography system 100. In some implementations, the inspection device 504, the first camera device 504*a*, the second camera device 504*b*, the motors 510, the motors 514, the controller 518, and/or one or more components included in the lithography system 100 may include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
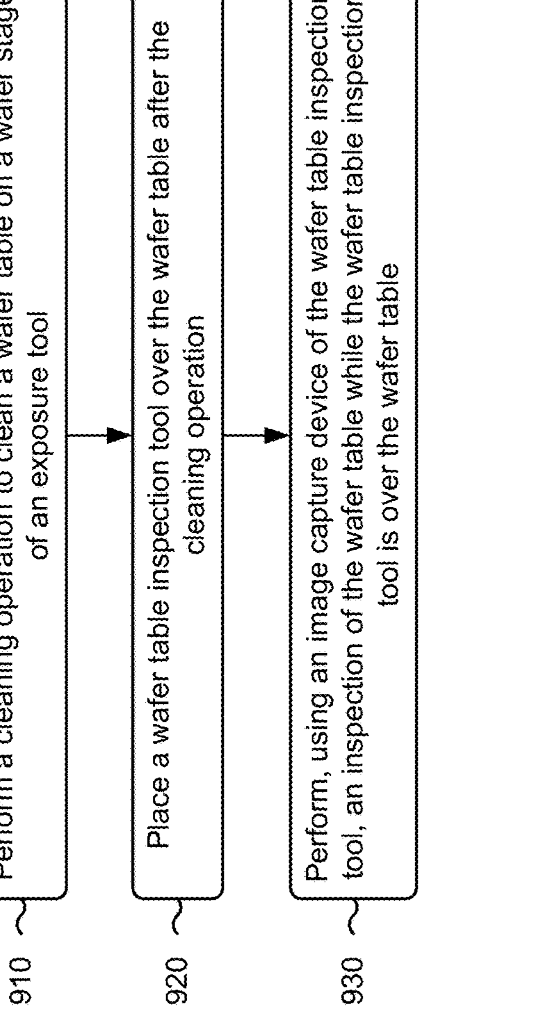
FIGS. 9-11 are flowcharts of example processes relating to inspecting a wafer table described herein.

FIG. 9 is a flowchart of an example process 900 associated with inspecting a wafer table as described herein. In some implementations, one or more process blocks of FIG. 9 may be performed by a wafer table inspection tool (e.g., the wafer table inspection tool 500). In some implementations, one or more process blocks of FIG. 9 may be performed by another device or a group of devices separate from or including the inspection tool, such as a controller (e.g., the controller 518, the device 800) among other examples. Additionally, or alternatively, one or more process blocks of FIG. 9 may be performed by one or more components of device 800, such as processor 820, memory 830, input component 840, output component 850, and/or communication component 860.

As shown in FIG. 9, process 900 may include performing a cleaning operation to clean a wafer table on a wafer stage of an exposure tool (block 910). For example, a cleaning operation 704 may be performed to clean the wafer table 212 on the wafer stage 136 of the exposure tool 104, as described above.

As further shown in FIG. 9, process 900 may include placing a wafer table inspection tool (500) over the wafer table after the cleaning operation (block 920). For example, the wafer table inspection tool 500 may be placed over the wafer table 212 after the cleaning operation 704, as described above.

As further shown in FIG. 9, process 900 may include performing, using an image capture device of the wafer table inspection tool, an inspection of the wafer table while the wafer table inspection tool is over the wafer table (block 930). For example, the wafer table inspection tool 500 may perform, using an image capture device (e.g., the first camera device 504*a*, the second camera device 504*b*) of the wafer table inspection tool 500, an inspection (e.g., the inspection described in connection with the example implementation 600, the inspection described in connection with the example implementation 700) of the wafer table 212 while the wafer table inspection tool 500 is over the wafer table, as described above. In some implementations, the image capture device of the wafer table inspection tool 500 is used to inspect a plurality of surface burls 304 on the wafer table 212.

Process 900 may include additional implementations, such as any single implementation or any combination of implementations described below and/or in connection with one or more other processes described elsewhere herein.

In a first implementation, process 900 includes placing the wafer table inspection tool 500 on the balance mass 208 of the exposure tool such that the wafer table inspection tool 500 is over the wafer table 212 and over the wafer stage 136. In a second implementation, alone or in combination with the first implementation, process 900 includes removing the bottom module 138 from the exposure tool 104, where the bottom module 138 includes the wafer table 212 and the wafer stage 136, and where performing the inspection of the wafer table 212 includes performing, using the image capture device (e.g., the first camera device 504*a*, the second camera device 504*b*) of the wafer table inspection tool 500, the inspection of the wafer table while the bottom module 138 is removed from the exposure tool and while the wafer table 212 and the wafer stage 136 are in the bottom module 138.

In a third implementation, alone or in combination with one or more of the first and second implementations, process 900 includes performing, using the image capture device (e.g., the first camera device 504*a*, the second camera device 504*b*) of the wafer table inspection tool 500, the inspection of the wafer table 212 while the wafer table 212 is at atmospheric pressure. In a fourth implementation, alone or in combination with one or more of the first through third implementations, process 900 includes generating, using the image capture device (e.g., the first camera device 504*a*, the second camera device 504*b*) of the wafer table inspection tool 500, a respective image for each surface burl 304 of the plurality of surface burls 304.

In a fifth implementation, alone or in combination with one or more of the first through fourth implementations, process 900 includes performing a wide angle scan (e.g., the scan 602, the scan 708) to determine the center 604 of the wafer table 212, and performing a plurality of surface burl scans (e.g., the scans 606, the scans 712) in a scanning pattern (e.g., the scanning pattern 608 or another scanning pattern) to generate the respective image for each surface burl 304 of the plurality of surface burls 304. In a sixth implementation, alone or in combination with one or more of the first through fifth implementations, performing the inspection of the wafer table 212 includes performing the inspection of the wafer table 212 to at least one of determine whether a performance of the cleaning operation satisfies one or more performance thresholds or determine surface wear condition for the plurality of surface burls.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Figure 10:
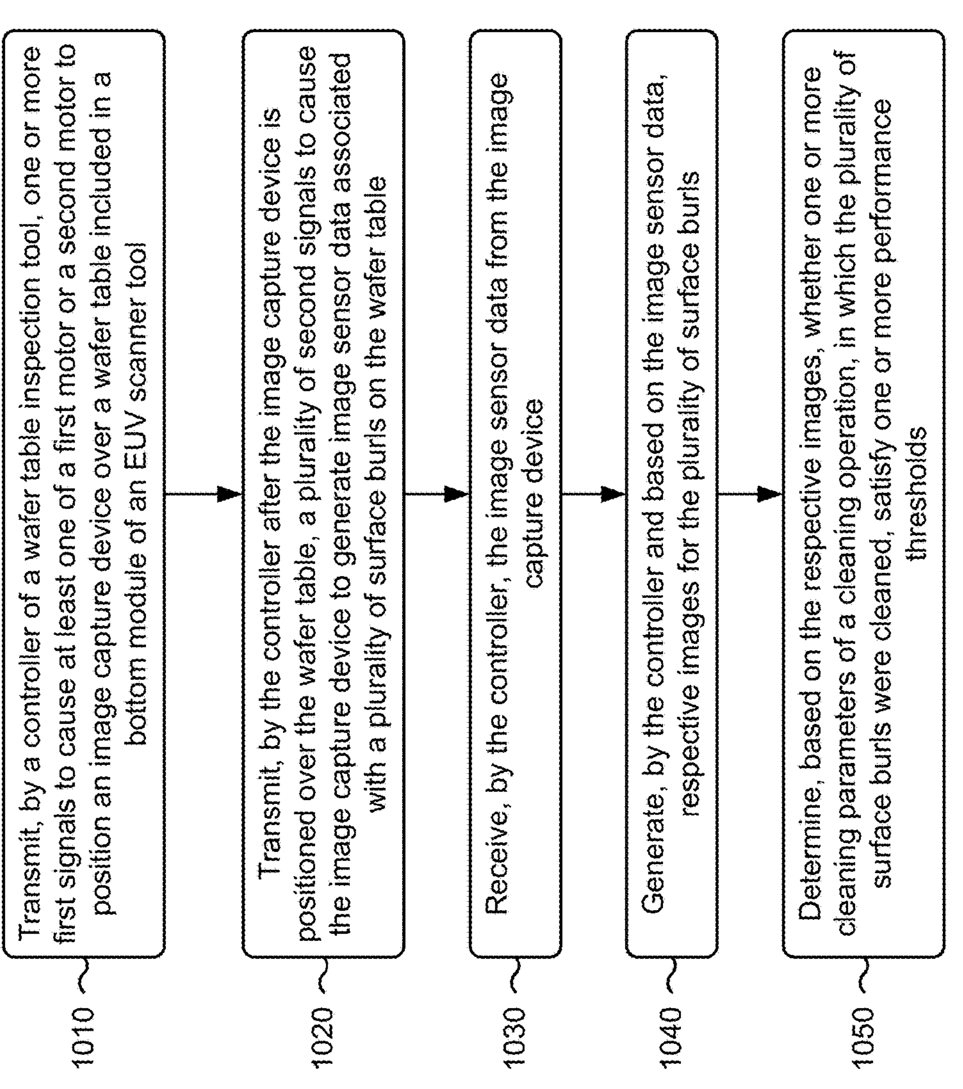

FIG. 10 is a flowchart of an example process 1000 associated with inspecting a wafer table as described herein. In some implementations, one or more process blocks of FIG. 10 may be performed by a controller (e.g., the controller 518, the device 800). In some implementations, one or more process blocks of FIG. 10 may be performed by another device or a group of devices separate from or including the controller, such as a wafer table inspection tool (e.g., the wafer table inspection tool 500) among other examples. Additionally, or alternatively, one or more process blocks of FIG. 10 may be performed by one or more components of device 800, such as processor 820, memory 830, input component 840, output component 850, and/or communication component 860.

As shown in FIG. 10, process 1000 may include transmitting one or more first signals to cause at least one of a first motor or a second motor to position an inspection device over a wafer table included in a bottom module of an EUV scanner tool (block 1010). For example, the controller 518 may transmit one or more first signals (e.g., signal(s) 706*a*) to cause at least one of a first motor (e.g., the motor 510) or a second motor (e.g., the motor 514) to position an inspection device (e.g., the inspection device 504, the first camera device 504*a*, the second camera device 504*b*) over the wafer table 212 included in the bottom module 138 of an EUV scanner tool (e.g., the exposure tool 104), as described above.

As further shown in FIG. 10, process 1000 may include transmitting a plurality of second signals to cause the inspection device to generate image sensor data associated with a plurality of surface burls on the wafer table (block 1020). For example, the controller 518 may transmit a plurality of second signals (e.g., the signal(s) 710*b*) to cause the inspection device to generate the image sensor data 714 associated with a plurality of surface burls 304 on the wafer table 212, as described above.

As further shown in FIG. 10, process 1000 may include receiving the image sensor data from the inspection device (block 1030). For example, the controller 518 may receive the image sensor data 714 from the inspection device, as described above.

As further shown in FIG. 10, process 1000 may include generating, based on the image sensor data, respective images for the plurality of surface burls (block 1040). For example, the controller 518 may generate, based on the image sensor data 714, respective images for the plurality of surface burls 304, as described above.

As further shown in FIG. 10, process 1000 may include determining, based on the respective images, whether one or more cleaning parameters of a cleaning operation, in which the plurality of surface burls were cleaned, satisfy one or more performance thresholds (block 1050). For example, the controller 518 may determine, based on the respective images, whether one or more cleaning parameters of a cleaning operation, in which the plurality of surface burls 304 were cleaned, satisfy one or more performance thresholds, as described above.

Process 1000 may include additional implementations, such as any single implementation or any combination of implementations described below and/or in connection with one or more other processes described elsewhere herein.

In a first implementation, determining whether the one or more cleaning parameters satisfy the one or more performance thresholds includes determining whether a surface roughness of the plurality of surface burls 304 satisfies a surface roughness threshold. In a second implementation, alone or in combination with the first implementation, the surface roughness threshold is included in a range of approximately 2 nanometers to approximately 8 nanometers.

In a third implementation, alone or in combination with one or more of the first and second implementations, determining whether the one or more cleaning parameters satisfy the one or more performance thresholds includes determining that the one or more cleaning parameters do not satisfy the one or more performance thresholds, and the process 1000 includes transmitting a third signal to cause a notification to be outputted, where the notification indicates that another cleaning operation is to be performed. In a fourth implementation, alone or in combination with one or more of the first through third implementations, the inspection process 1000 includes transmitting, to a first camera device (e.g., the first camera device 504*a*) of the inspection device, a third signal (e.g., the signal 706*b*) to cause the first camera device to generate the image sensor data associated with a location of the wafer table 212, and determining, based on the image sensor data associated with the location of the wafer table 212, that the inspection device 504 is positioned over the wafer table 212.

In a fifth implementation, alone or in combination with one or more of the first through fourth implementations, transmitting the plurality of second signals includes transmitting, to a second camera device (e.g., the second camera device 504*b*) of the inspection device, the plurality of second signals to cause the second camera device to generate the image sensor data 714 associated with the plurality of surface burls 304. In a sixth implementation, alone or in combination with one or more of the first through fifth implementations, the process 1000 includes transmitting a plurality of fourth signals (e.g., the signals 710*a*) to cause at least one of the first motor 510 or the second motor 514 to move the second camera device along a scanning pattern (e.g., the scanning pattern 608 or another scanning pattern), where transmitting the plurality of second signals to cause the second camera device to generate the image sensor data 714 associated with the plurality of surface burls 304 includes transmitting the plurality of second signals to cause the second camera device to generate the image sensor data 714 associated with the plurality of surface burls 304 while the second camera device is moved along the scanning pattern.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
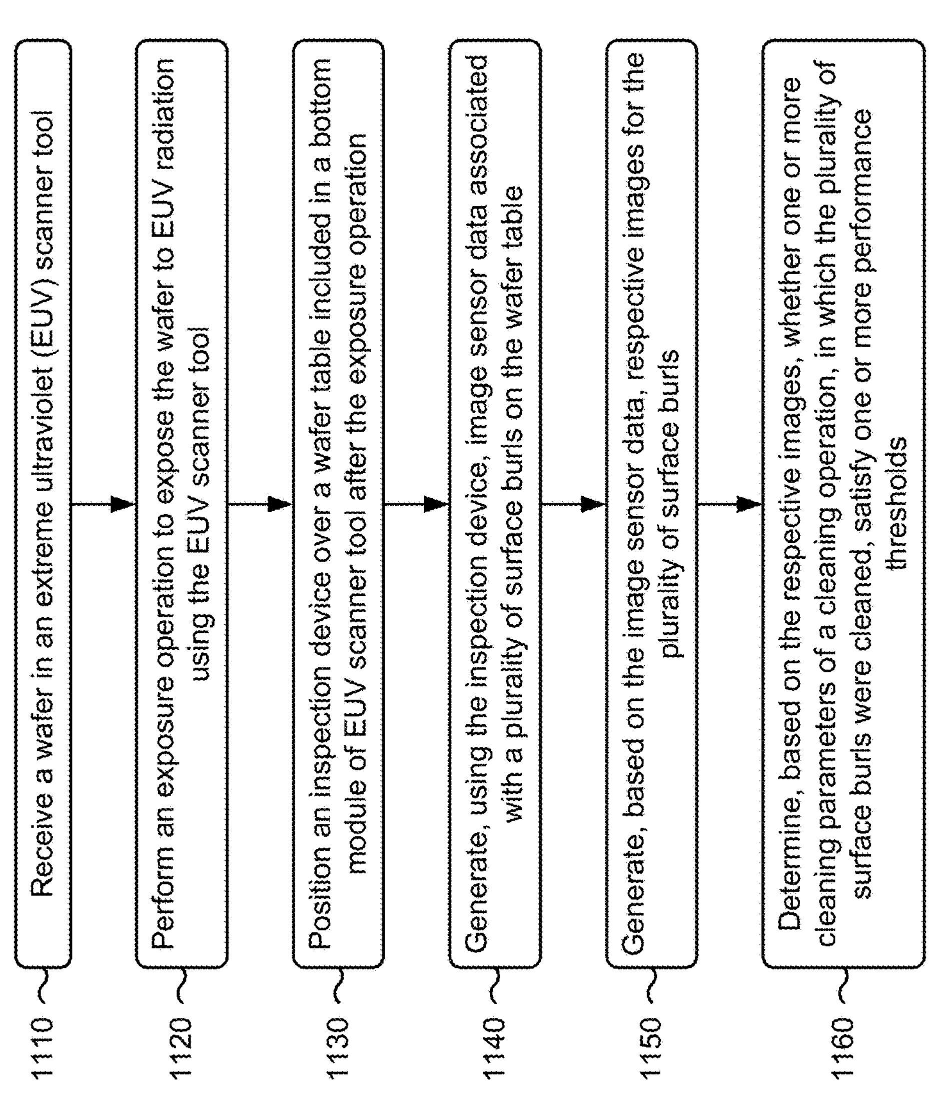

FIG. 11 is a flowchart of an example process 1100 associated with inspecting a wafer table. In some implementations, one or more process blocks of FIG. 11 may be performed by a wafer table inspection tool (e.g., the wafer table inspection tool 500). In some implementations, one or more process blocks of FIG. 11 may be performed by another device or a group of devices separate from or including a controller (e.g., the controller 518, the device 800), an EUV scanner tool (e.g., the exposure tool 104), and/or a lithography system (e.g., the lithography system 100), among other examples. Additionally, or alternatively, one or more process blocks of FIG. 10 may be performed by one or more components of device 800, such as processor 820, memory 830, input component 840, output component 850, and/or communication component 860.

As shown in FIG. 11, process 1100 may include receiving a wafer in an EUV scanner tool (block 1110). For example, the lithography system 100 may receive a wafer in an EUV scanner tool (e.g., the exposure tool 104), as described herein.

As further shown in FIG. 11, process 1100 may include performing an exposure operation to expose the wafer to EUV radiation using the EUV scanner tool (block 1120). For example, the lithography system 100 may perform an exposure operation to expose the wafer to EUV radiation using the EUV scanner tool, as described herein.

As further shown in FIG. 11, process 1100 may include positioning an inspection device over a wafer table included in a bottom module of EUV scanner tool after the exposure operation (block 1130). For example, the wafer table inspection tool 500 may position an inspection device over a wafer table included in a bottom module of EUV scanner tool after the exposure operation, as described above.

As further shown in FIG. 11, process 1100 may include generating, using the inspection device, image sensor data associated with a plurality of surface burls on the wafer table (block 1140). For example, the wafer table inspection tool 500 may generate, using the inspection device, image sensor data associated with a plurality of surface burls on the wafer table, as described above.

As further shown in FIG. 11, process 1100 may include generating, based on the image sensor data, respective images for the plurality of surface burls (block 1150). For example, the wafer table inspection tool 500 may generate, based on the image sensor data, respective images for the plurality of surface burls, as described above.

As further shown in FIG. 11, process 1100 may include determining, based on the respective images, whether one or more cleaning parameters of a cleaning operation, in which the plurality of surface burls were cleaned, satisfy one or more performance thresholds (block 1160). For example, the wafer table inspection tool 500 may determine, based on the respective images, whether one or more cleaning parameters of a cleaning operation, in which the plurality of surface burls were cleaned, satisfy one or more performance thresholds, as described above.

Process 1100 may include additional implementations, such as any single implementation or any combination of implementations described below and/or in connection with one or more other processes described elsewhere herein.

In a first implementation, determining whether the one or more cleaning parameters satisfy the one or more performance thresholds comprises determining whether a surface roughness of the plurality of surface burls satisfies a surface roughness threshold. In a second implementation, alone or in combination with the first implementation, the surface roughness threshold is included in a range of approximately 2 nanometers to approximately 8 nanometers. In a third implementation, alone or in combination with one or more of the first and second implementations, determining whether the one or more cleaning parameters satisfy the one or more performance thresholds comprises determining that the one or more cleaning parameters do not satisfy the one or more performance thresholds, and wherein the method further comprises transmitting a third signal to cause a notification to be outputted, wherein the notification indicates that another cleaning operation is to be performed.

In a fourth implementation, alone or in combination with one or more of the first through third implementations, process 1100 includes generating, using the first camera device, image sensor data associated with a location of the wafer table, and determining, based on the image sensor data associated with the location of the wafer table, that the inspection device is positioned over the wafer table. In a fifth implementation, alone or in combination with one or more of the first through fourth implementations, generating the image sensor data comprises generating, using a second camera device of the inspection device, the image sensor data associated with the plurality of surface burls. In a sixth implementation, alone or in combination with one or more of the first through fifth implementations, process 1100 includes moving, using at least one of the first motor or the second motor, the second camera device along a scanning pattern, wherein generating the image sensor data associated with the plurality of surface burls comprises generating, using the second camera device, the image sensor data associated with the plurality of surface burls while the second camera device is moved along the scanning pattern.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, the wafer table inspection tool is capable of being positioned over a wafer table while the wafer table is positioned in a bottom module of an exposure tool of a lithography system. The wafer table inspection tool is capable of quickly generating inspection images for evaluating the condition of surface burls on the wafer table, and for evaluating cleaning performance of a cleaning operation in which the surface burls are cleaned.

As described in greater detail above, some implementations described herein provide a method. The method includes performing a cleaning operation to clean a wafer table on a wafer stage of an exposure tool. The method includes placing a wafer table inspection tool over the wafer table after the cleaning operation. The method includes performing, using an image capture device of the wafer table inspection tool, an inspection of the wafer table while the wafer table inspection tool is over the wafer table, where the image capture device of the wafer table inspection tool is used to inspect a plurality of surface burls on the wafer table.

As described in greater detail above, some implementations described herein provide a method. The method includes transmitting, by a controller of a wafer table inspection tool, one or more first signals to cause at least one of a first motor or a second motor to position an inspection device over a wafer table included in a bottom module of an EUV scanner tool. The method includes transmitting, by the controller after the inspection device is positioned over the wafer table, a plurality of second signals to cause the inspection device to generate image sensor data associated with a plurality of surface burls on the wafer table. The method includes receiving, by the controller, the image sensor data from the inspection device. The method includes generating, by the controller and based on the image sensor data, respective images for the plurality of surface burls. The method includes determining, based on the respective images, whether one or more cleaning parameters of a cleaning operation, in which the plurality of surface burls were cleaned, satisfy one or more performance thresholds.

As described in greater detail above, some implementations described herein provide a wafer table inspection tool. The wafer table inspection tool includes a support frame configured to be positioned over a wafer table while the wafer table is positioned on a wafer stage in a bottom module of an EUV lithography system, and while the bottom module is at least partially removed from the EUV lithography system to provide access to the wafer table. The wafer table inspection tool includes an inspection device, secured to the support frame, configured to inspect the wafer table while the wafer table is positioned on the wafer stage in the bottom module.

As described in greater detail above, some implementations described herein provide a method. The method includes receiving a wafer in an EUV scanner tool. The method includes performing an exposure operation to expose the wafer to EUV radiation using the EUV scanner tool. The method includes positioning an inspection device over a wafer table included in a bottom module of EUV scanner tool after the exposure operation. The method includes generating, using the inspection device, image sensor data associated with a plurality of surface burls on the wafer table. The method includes generating, based on the image sensor data, respective images for the plurality of surface burls. The method includes determining, based on the respective images, whether one or more cleaning parameters of a cleaning operation, in which the plurality of surface burls were cleaned, satisfy one or more performance thresholds.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

performing a cleaning operation to clean a wafer table on a wafer stage of an exposure tool configured to expose a wafer on the wafer table to extreme ultraviolet (EUV) radiation;

placing a wafer table inspection tool over the wafer table after the cleaning operation; and performing, using an image capture device of the wafer table inspection tool, an inspection of the wafer table while the wafer table inspection tool is over the wafer table, wherein the image capture device of the wafer table inspection tool is used to inspect a plurality of surface burls on the wafer table;

partially removing a bottom module from the exposure tool, wherein the bottom module includes the wafer table and the wafer stage; and wherein performing the inspection of the wafer table comprises:

performing, using the image capture device of the wafer table inspection tool, the inspection of the wafer table while the bottom module is partially removed from the exposure tool and while the wafer table and the wafer stage are in the bottom module.

2. The method of claim 1, wherein placing the wafer table inspection tool over the wafer table comprises:

placing the wafer table inspection tool on a balance mass of the exposure tool such that the wafer table inspection tool is over the wafer table and over the wafer stage.

3. The method of claim 1, wherein performing the inspection of the wafer table comprises:

performing, using the image capture device of the wafer table inspection tool, the inspection of the wafer table while the wafer table is at atmospheric pressure.

4. The method of claim 1, wherein performing the inspection of the wafer table comprises:

generating, using the image capture device of the wafer table inspection tool, a respective image for each surface burl of the plurality of surface burls.

5. The method of claim 1, wherein performing the inspection of the wafer table comprises:

performing the inspection of the wafer table to at least one of:

determine whether a performance of the cleaning operation satisfies one or more performance thresholds, or determine a surface wear condition for the plurality of surface burls.

6. The method of claim 4, wherein generating the respective image for each surface burl of the plurality of surface burls comprises:

performing a scan of the wafer table to determine a center of the wafer table; and performing a plurality of surface burl scans in a scanning pattern to generate the respective image for each surface burl of the plurality of surface burls.

7. A method, comprising:

receiving a wafer on a wafer table positioned in a bottom module of an extreme ultraviolet (EUV) scanner tool;

performing an exposure operation to expose the wafer to EUV radiation using the EUV scanner tool;

positioning an inspection device over the wafer table included in the bottom module of the EUV scanner tool after the exposure operation, while the bottom module is at least partially removed from the EUV scanner tool;

generating image sensor data associated with a plurality of surface burls on the wafer table using the inspection device while the bottom module is at least partially removed from the EUV scanner tool;

generating, based on the image sensor data, respective images for the plurality of surface burls; and determining, based on the respective images, whether one or more cleaning parameters of a cleaning operation, in which the plurality of surface burls were cleaned, satisfy one or more performance thresholds.

8. The method of claim 7, wherein determining whether the one or more cleaning parameters satisfy the one or more performance thresholds comprises:

determining whether a surface wear of the plurality of surface burls satisfies a surface wear threshold.

9. The method of claim 7, wherein determining whether the one or more cleaning parameters satisfy the one or more performance thresholds comprises:

determining that the one or more cleaning parameters do not satisfy the one or more performance thresholds; and wherein the method further comprises:

transmitting a signal to cause a notification to be outputted, wherein the notification indicates that another cleaning operation is to be performed.

10. The method of claim 7, further comprising:

generating, using a first camera device, image sensor data associated with a location of the wafer table; and determining, based on the image sensor data associated with the location of the wafer table, that the inspection device is positioned over the wafer table while the bottom module is at least partially removed from the EUV scanner tool.

11. The method of claim 8, wherein the surface wear threshold is included in a range of approximately 2 nanometers to approximately 8 nanometers.

12. The method of claim 10, wherein generating the image sensor data associated with the plurality of surface burls comprises:

generating, using a second camera device of the inspection device, the image sensor data associated with the plurality of surface burls.

13. The method of claim 10, wherein determining that the inspection device is positioned over the wafer table comprises at least one of:

identifying a center of the wafer table, or identifying an edge of the wafer table.

14. The method of claim 12, further comprising:

moving, using at least one of a first motor or a second motor, the second camera device along a scanning pattern that enables scanning of all burls of the plurality of surface burls, wherein generating the image sensor data associated with the plurality of surface burls comprises:

generating, using the second camera device, the image sensor data associated with the plurality of surface burls while the second camera device is moved along the scanning pattern.

15. A method performed by a wafer table inspection tool comprising an inspection device and a support frame, the method comprising:

receiving a wafer on a wafer table positioned in a bottom module of an extreme ultraviolet (EUV) lithography system;

performing an exposure operation to expose the wafer to EUV radiation using the EUV lithography system;

positioning an inspection device over the wafer table included in the bottom module of the EUV lithography system after the exposure operation, while the bottom module is at least partially removed from the EUV lithography system;

inspecting, by the inspection device, the wafer table while the wafer table is positioned on a wafer stage in the bottom module of the EUV lithography system, and while the bottom module is at least partially removed from the EUV lithography system to provide access to the wafer table; and generating image sensor data using the inspection device while the bottom module is at least partially removed from the EUV lithography system, wherein the inspection device is secured to the support frame, and wherein the support frame is positioned over the wafer table while the wafer table is positioned on the wafer stage while the bottom module is at least partially removed from the EUV lithography system.

16. The method of claim 15, wherein inspecting the wafer table comprises:

inspecting the wafer table prior to a first use of the wafer table in the EUV lithography system; and wherein the wafer table inspection tool comprises:

a controller that generates, based on image sensor data received from the inspection device, baseline images of a plurality of surface burls on the wafer table, wherein the image sensor data is based on an inspection of the wafer table prior to the first use of the wafer table.

17. The method of claim 15, wherein the inspection device comprises:

a first camera device that performs a first scan of the wafer table for locating a center point of the wafer table; and a second camera device that performs a plurality of second scans of the wafer table to inspect the wafer table.

18. The method of claim 15, wherein the support frame provides movement of the inspection device in at least two axes to enable inspection of a plurality of surface burls on the wafer table.

19. The method of claim 16, wherein inspecting the wafer table further comprises:

inspecting the wafer table after the first use of the wafer table in the EUV lithography system; and wherein the controller:

generates inspection images of the plurality of surface burls after the first use of the wafer table;

compares the inspection images and the baseline images; and determines an estimated service life of the wafer table based on a comparison of the inspection images and the baseline images.

20. The method of claim 19, wherein the controller determines the estimated service life of the wafer table using a machine learning model, wherein the inspection images and the baseline images are used as input to the machine learning model.

* * * * *